United States Patent
Jou et al.

(10) Patent No.: US 11,985,781 B2
(45) Date of Patent: May 14, 2024

(54) SURFACE TREATMENT FOR METALLIC COMPONENTS

(71) Applicant: Apple Inc., Cupertino, CA (US)

(72) Inventors: Herng-Jeng Jou, San Jose, CA (US); Hoishun Li, San Jose, CA (US); James A. Yurko, Saratoga, CA (US)

(73) Assignee: APPLE INC., Cupertino, CA (US)

( * ) Notice: Subject to any disclaimer, the term of this patent is extended or adjusted under 35 U.S.C. 154(b) by 73 days.

(21) Appl. No.: 17/446,432

(22) Filed: Aug. 30, 2021

(65) Prior Publication Data

US 2022/0095467 A1 Mar. 24, 2022

Related U.S. Application Data

(60) Provisional application No. 63/082,211, filed on Sep. 23, 2020.

(51) Int. Cl.
| | |
|---|---|
| *H04M 1/02* | (2006.01) |
| *B21D 22/02* | (2006.01) |
| *H05K 5/02* | (2006.01) |
| *C21D 7/06* | (2006.01) |
| *C22F 1/00* | (2006.01) |

(52) U.S. Cl.
CPC .......... *H05K 5/0286* (2013.01); *B21D 22/02* (2013.01); *H04M 1/026* (2013.01)

(58) Field of Classification Search
None
See application file for complete search history.

(56) References Cited

U.S. PATENT DOCUMENTS

| | | | |
|---|---|---|---|
| 5,540,883 A | * | 7/1996 | Jones .................. C22C 33/0207 419/57 |
| 5,826,453 A | | 10/1998 | Prevey, III |
| 2021/0092856 A1 | | 3/2021 | Jou et al. |

FOREIGN PATENT DOCUMENTS

| | | |
|---|---|---|
| CN | 2817297 Y | 9/2006 |
| CN | 1965421 A | 5/2007 |
| CN | 101522518 A | 9/2009 |
| CN | 102574362 A | 7/2012 |
| CN | 104837584 A | 8/2015 |
| CN | 107073873 A | 8/2017 |
| CN | 107570704 A | 1/2018 |
| CN | 110956245 A | 4/2020 |
| CN | 110970189 A | 4/2020 |
| CN | 111295069 A | 6/2020 |
| CN | 111491469 A | 8/2020 |
| EP | 0019835 A1 | 12/1980 |
| WO | 2009102848 A1 | 8/2009 |

OTHER PUBLICATIONS

Elshennawy, Ahmad K. Weheba, Gamal S. (2015). Manufacturing Processes and Materials (5th Edition)—25.4.1 Roller Burnishing. Society of Manufacturing Engineers (SME), pp. 595-611. (Year: 2015).*

* cited by examiner

*Primary Examiner* — Adam Krupicka
(74) *Attorney, Agent, or Firm* — Dorsey & Whitney LLP

(57) ABSTRACT

A component for an electronic device can include a metal injection molded (MIM) metallic body that at least partially defines an exterior surface. The metallic body can have an average porosity less than 1% in a first region that extends from the external surface to a depth of at least 100 microns below the external surface, and an average porosity greater than 1% in a second region adjacent to the first region.

15 Claims, 29 Drawing Sheets

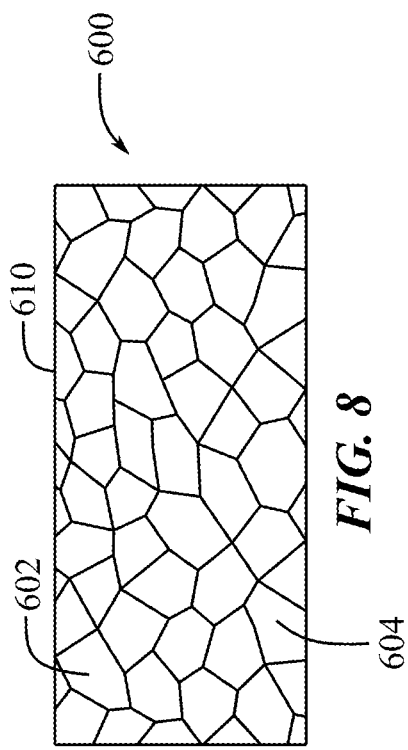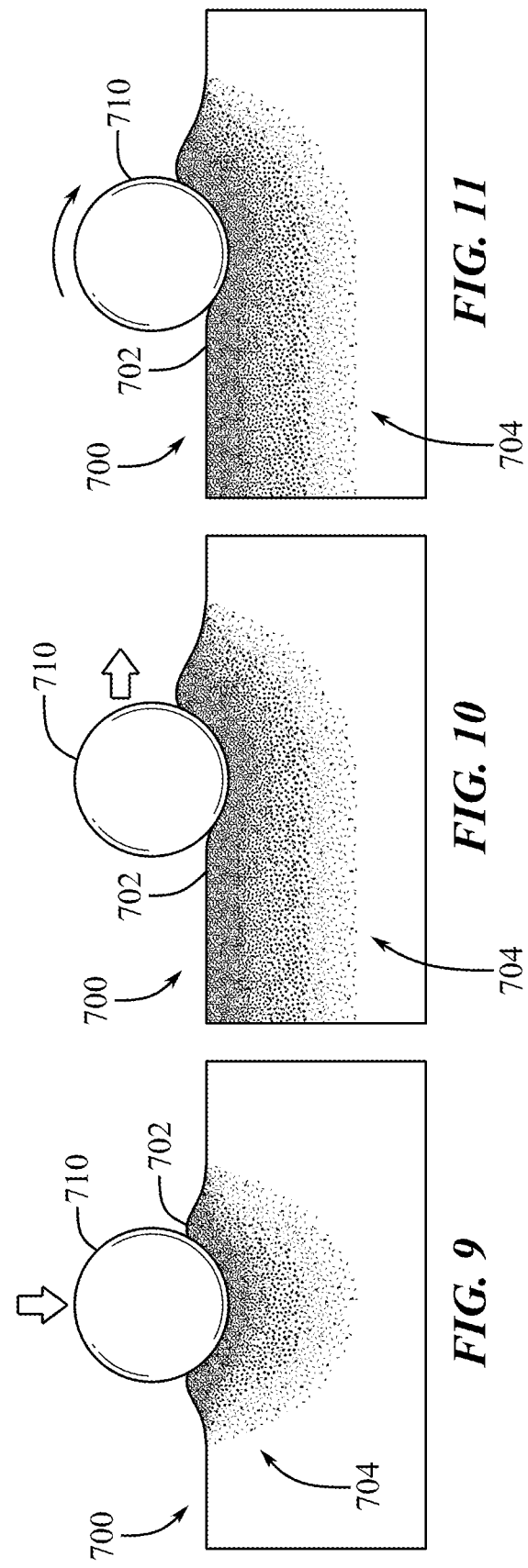

SURFACE TREATMENT FOR METALLIC COMPONENTS

CROSS-REFERENCED TO RELATED APPLICATION(S)

This application claims the benefit of priority to 1) U.S. Patent Application No. 63/082,211, filed 23 Sep. 2020, and titled "SURFACE TREATMENT FOR METALLIC COMPONENTS," 2) U.S. patent application Ser. No. 17/028,380, filed 22 Sep. 2020, and titled "SURFACE NANOGRAIN FOR IMPROVED DURABILITY OF METAL BANDS," and U.S. Patent Application No. 62/904,055, filed 23 Sep. 2019, and titled "SURFACE NANOGRAIN FOR IMPROVED DURABILITY OF METAL BANDS," the disclosures of which are incorporated herein by reference in their entireties.

FIELD

The present description relates generally to an electronic device. More particularly, the present description relates to enclosures for electronic devices.

BACKGROUND

Electronic devices are widespread in society and can take a variety of forms, from wristwatches to computers. Electronic devices, including portable electronic devices such as handheld phones, tablet computers, and watches, can experience contact with various surfaces during use. Further, use, transportation, and storage can exert mechanical and thermal stresses on such devices.

Components for these devices, such as enclosures or housings, can benefit from exhibiting different combinations of properties relating to the use of the device. A housing for a portable electronic device can have a combination of properties, such as strength, appearance, toughness, abrasion resistance, weight, corrosion resistance, thermal conductivity, and electromagnetic shielding, in order for the device to function as desired. Certain materials can provide a desired level of performance with respect to some properties, but often provide less than optimal levels of performance with respect to others. Accordingly, it can be desirable to provide a device enclosure that can include multiple materials to achieve a desired level of performance with respect to as many desired properties as possible.

SUMMARY

According to some examples of the present disclosure, a component for an electronic device can include a metallic body at least partially defining an exterior surface, the metallic body can have a porosity less than 1% in a first region that extends from the external surface to a depth of at least 100 microns below the external surface, and the metallic body can have a porosity greater than 1% in a second region adjacent to the first region.

In some examples, the metallic body is a metal injection molded body. The metallic body can have a porosity less than 0.5% in the first region. The metallic body can include steel. The metallic body can include aluminum. The metallic body can have fewer than 1000 pores per cubic millimeter in the first region. The metallic body can have an average pore size of less than about 3 microns in the first region. A portion of the metallic body defining the exterior surface can be polished. The exterior surface can be an exterior surface of the electronic device. The component can be a SIM tray.

According to some examples, a method of treating a component for an electronic device can include contacting a first metallic surface of the component with a tool to plastically deform the first metallic surface to a first desired depth, the tool exerting a pressure of at least 100 bar on the first metallic surface and translating across the first metallic surface at a rate of at least 1.25 meters per minute (m/min), contacting a polymeric surface of the component with the tool, the polymeric surface adjacent to the first metallic surface, contacting a second metallic surface of the component with the tool to plastically deform the second metallic surface to a second desired depth, the tool exerting a pressure of at least 100 bar on the second metallic surface, and translating across the second metallic surface at a rate of at least 1.25 m/min. The process can align the first metallic surface, the polymeric surface, and the second metallic surface in a plane.

In some examples, contacting the polymeric surface of the component with the tool exerts a pressure of at least 100 bar on the polymeric surface. Contacting the first metallic surface of the component with the tool can exert a pressure of at least 300 bar on the first metallic surface, and contacting the second metallic surface of the component with the tool can exert a pressure of at least 300 bar on the second metallic surface. The method can further include closing a gap between at least the first metallic surface and the polymeric surface. The first metallic surface and the second metallic surface can include steel.

According to some examples, a method of treating a component for an electronic device can include contacting a surface of a metallic region of the component with a tool to plastically deform the region, the tool exerting a pressure of at least 100 bar on the surface of the metallic region and translating across the first metallic surface at a rate of at least 1.25 m/min, and modifying a cluster of first grains positioned at the region so that at least some of the first grains are disposed between at least some second grains at the region, the first grains including a first phase and the second grains including a second, different phase. The method can further include reducing an average grain size of first grains of the cluster of first grains, the first grains disposed in a region of the component below the metallic surface. The metallic surface can include steel. The first phase can include a sigma phase. The method can further include polishing the region of the metallic surface.

BRIEF DESCRIPTION OF THE DRAWINGS

The disclosure will be readily understood by the following detailed description in conjunction with the accompanying drawings, wherein like reference numerals designate like structural elements, and in which:

FIG. 8 shows a cross-sectional view of a portion of a component of an electronic device.

FIG. 9 shows a cross-sectional view of a portion of a component of an electronic device being subjected to a process.

FIG. 10 shows a cross-sectional view of a portion of a component of an electronic device being subjected to a process.

FIG. 11 shows a cross-sectional view of a portion of a component of an electronic device being subjected to a process.

DETAILED DESCRIPTION

Figure 1:
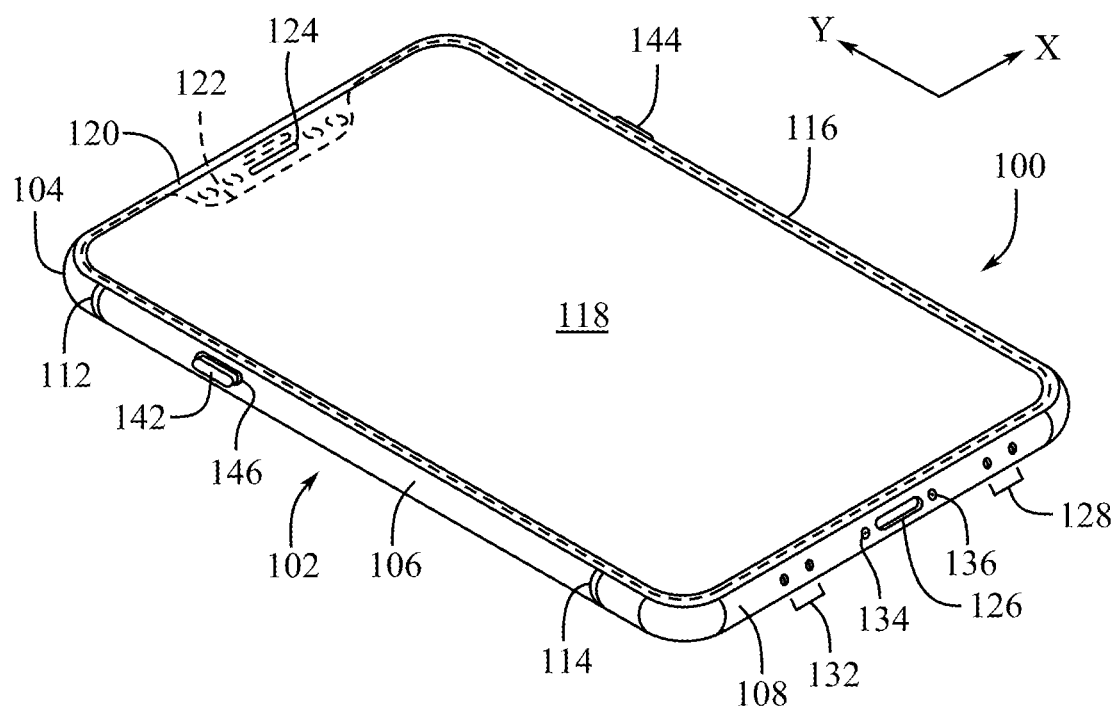
FIG. 1 shows a top perspective view of an electronic device.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents that can be included within the spirit and scope of the described embodiments, as defined by the appended claims.

One aspect of the present disclosure relates to a metallic component for an electronic device, such as a stainless steel housing, at least partially defining an exterior surface of the electronic device. A first region of the metallic component extending from the surface to a depth of at least 100 microns into the component can have an average grain size less than 45 nanometers and/or an average hardness greater than 3.5 gigapascals (GPa), while a second region of the component extending from the first region into the component to a depth of at least 900 microns can have an average grain size larger than 45 nanometers and/or an average hardness less than 3.5 GPa. Further, the grains of the first region can be distributed along a gradient transitioning from a first average grain size at the surface of the metallic component, to a second, larger grain size at the portion of the first region adjacent to the second region.

The metallic component can be formed or shaped, and even integrated with one or more additional components of the electronic device prior to being subjected to a treatment to form the above-described refined microstructure of the first region. That is, prior to being subjected to a treatment or process as described herein, the first region of the component can have a substantially similar microstructure to the second region, for example having an average grain size larger than 45 nanometers and/or an average hardness less than 3.5 GPa, for example having an average grain size of about 50 nanometers and an average hardness of about 3.2 GPa. A treatment to modify or refine the microstructure of the first region to include the refined microstructure described herein can include plastically deforming a desired portion of the surface of the metallic component to a depth of, for example, 10 microns at a rate of 1.25 m/min. The deformation can be achieved by translatably contacting a tool to the metallic surface, for example by rolling or grinding the tool against the surface. The tool can include a rounded contact portion having a diameter of, for example, less than 10 millimeters.

In some examples, a component being treated according to the processes described herein, and/or having a refined microstructure as described herein, can allow for the selection of a material or materials of the component to optimize certain desired properties, for example machinability or magnetic permeability, while also providing a desired level of hardness, durability, corrosion resistance, and other desired properties at desired locations or portions of the component.

For example, a housing made primarily of a metallic material, such as a stainless steel alloy can be relatively easily machined, low cost, and have other desired properties, such as a desired cosmetic appearance and desired magnetic properties. However, a component including such a stainless steel alloy often does not have desired levels of hardness, durability, or corrosion resistance without further treatment. On the other hand, for housings or other components requiring high strength materials and surfaces, a work-hardened bar or plate of metal material can be machined into a desired shape using a CNC machine. However, machining hardened metals, such as stainless steel, for example, involves longer cycle times, increases tool wear, and requires more energy.

In contrast, using the processes and methods described herein, a manufacturer can form a housing or other electronic component that exhibits high surface strength by first machining a relatively soft, annealed stainless steel bar or plate into shape, and then performing a hardening process on the shape. Machining the softer metal component using a CNC machine reduces tool wear, cycle time, and energy consumption. Then, using processes and methods described herein, the surface of the machined component can be hardened to meet durability requirements. In some examples, after such surface hardening processes are carried out, a finishing machining or polishing step can be performed, but only after the majority of machining has been performed prior to the hardening processes, thus extending the life of the machining tools, reducing power consumption, and reducing cycle times for higher manufacturing throughput.

Similarly, the manufacturer can start with a MIM stainless steel bar or plate, which is also soft relative to work hardened metals, and then machine the component prior to any surface hardening processes that are carried out as described herein. Such hardening processes, in addition to increasing strength and durability of the component, can reduce the porosity of portions of the MIM component, including portions at or near the surface. This reduced porosity can result in an enhanced aesthetic appearance of the component, as well as provide other advantageous material properties, as discussed in more detail below.

Further, a mismatch in hardness between layers formed over the surface of the component, such as a layer deposited by a physical vapor deposition (PVD) process and the component itself, can result in relatively high levels of interfacial stress between the surface and the layer. This interfacial stress can lead to undesirable layer delamination, for example, if the component experiences high levels of stress, such as during a drop event.

In contrast, a component having been subjected to a treatment, as described herein, to refine the grain structure and/or including a refined microstructure can have certain portions, for example, interior portions including the desired properties described above, while also having desired levels of surface hardness, durability, corrosion resistance, and interfacial stress with additional layers. In some examples, the entire surface or exterior of a component can be treated and/or have a refined microstructure, as described herein. In some examples, however, only select or desired portions of a component, such as portions of the component that may experience high stress or impacts, for example, the corner portions of a housing, can be treated and/or have a refined microstructure, as described herein.

A metallic component including a portion or portions having a refined microstructure with a first region adjacent to a surface having a smaller average grain size than a second region extending into the component from the first region can include a relatively high surface hardness or durability, as compared to an untreated portion of the component. The untreated portion can, for example, partially define an interior volume of the electronic device and can retain the properties of an untreated material, such as having a higher level of machinability than the first region, and having a desired level of magnetic permeability.

Additionally, the material properties of the first region including a smaller average grain size relative to the second region or untreated portions of the component, and/or a gradient distribution of grain sizes, can allow for reduced levels of interfacial stress with a layer formed over the surface of the first region. In situations where a layer, such as a ceramic layer deposited by a PVD process, is formed over the surface of a metallic component, the mismatch in hardness between the material of the PVD layer and the metallic component can result in extremely high interfacial stresses during high stress events, such as impacts. These high stresses can result in cracking of the PVD layer or delamination of the layer from the metallic component.

In contrast, a region having been subjected to a treatment and/or including a refined microstructure, as described herein, can have a higher hardness than untreated portions or regions of the metallic component. Accordingly, any hardness mismatch between the surface of the metallic component and the over layer can be reduced, and the interfacial stress can thus also be reduced. The reduced interfacial stresses experienced during loading, such as during an impact, can prevent or inhibit the formation of cracks and/or delamination of the layer from the metallic component.

A first region of a component having the refined microstructure described herein, for example including a smaller average grain size than a second region extending into the component from the first region, can be formed by any of the treatments or processes described herein, for example, via plastically deforming a portion of the surface to a desired depth by translatably contacting a tool to the surface. In some examples, the tool can have any desired geometry. In some examples, the tool can have a rounded contact portion, such as a spherical contact portion or a cylindrical contact portion. In some examples, the contact portion of the tool can be flat, concave, or can have a shape corresponding to a shape of the surface to be treated. That is, in some examples, the tool can have a contact portion matching a portion of a profile of the surface of the component being treated.

As compared with other techniques for affecting the grain sizes and/or microstructure of a metallic component, the treatments and processes described herein do not require the addition of thermal energy or heat to the component during processing. As such, a metallic component can be subjected to treatment after having been partially or fully integrated with one or more other components, without having to take precautions or additional process steps to prevent undesired amounts of thermal energy from being imparted to the other components. For example, a metallic component can be integrated with one or more plastic or polymer components, and can be subjected to a surface treatment or burnishing, as described herein, without melting, deforming, or otherwise affecting the plastic or polymer components.

Similarly, the processes described herein can be used to treat a desired portion of a metallic component, without substantially deforming the overall shape or geometry of the component. As such, the metallic component can be substantially preformed or shaped prior to the surface treatments described herein, and can avoid the need for subsequent additional shaping or forming. In contrast, other treatments or techniques that can result in a refined grain structure, such as forging and cold working, can result in undesirable levels of component deformation and can require reforming or reworking subsequent to treatment, thereby increasing the cost and processing time.

The processes and treatments described herein can be relatively inexpensive, and can require minimal or reduced processing time compared to traditional techniques for affecting material hardness or grain structure. The same tool used to perform such processes can be used to treat multiple components, for example, in sequential treatment operations, without the need to repair or replace the tool. Additionally, as described herein, the duration of the treatment can be relatively short and can be carried out on the component at any desired time during integration or assembly of the component into the electronic device, thereby preventing significant increases in production time or cost.

Additionally, the surface treatments described herein can result in a region of refined grains, that is a first region having a smaller average grain size than a second region extending into the component therefrom, that can be significantly larger or deeper than can be achieved with traditional techniques for affecting a component's grain structure. Traditional mechanical techniques for affecting the grains of a metallic material, such as shot peening, can generally only affect grains up to about 20 microns below the surface being treated. Accordingly, subsequent processing of the component, for example polishing to achieve a desired cosmetic appearance, can result in the removal of the entire affected region, thereby obviating any benefits of treatment. In contrast, the treatments and processes described herein can affect and/or refine the microstructure of a first region that can extend from the surface to a depth of at least 100 microns into the component, and in some examples, up to 800 microns into the component. The depth of the region allows for removal of significant portions of material, for example up to 50 microns during a polishing process, without removing the region having a desired microstructure.

In some examples, the surface treatment processes described herein can additionally or alternatively affect the structure, including the microstructure, of components in various other beneficial ways. For example, a surface treatment process as described herein can align various surfaces of a component to provide a pleasing aesthetic and tactile experience. These surfaces can even include multiple different materials, such as a metallic material and a polymeric material. In some examples, a surface treatment process can reduce or eliminate one or more gaps between various portions of a component, as described herein. In some examples, surface treatment processes described herein can modify clusters of grains of an intermetallic sigma phase. Such clusters can complicate polishing or other processes carried out on metallic components, and thus, the surface treatments described herein can reduce the size of clusters of these grains, or even reduce the size of the grains themselves. In some examples, the surface treatments described herein can reduce the porosity, number of pores, and/or average pore size of a component formed by a powder metallurgy process, such as a metal injection molding (MIM) process.

These and other embodiments are discussed below with reference to FIGS. 1-31B. However, those skilled in the art will readily appreciate that the detailed description given herein with respect to these Figures is for explanatory purposes only, and should not be construed as limiting.

FIG. 1 illustrates a perspective view of an example of an electronic device 100. The electronic device 100 shown in FIG. 1 is a mobile wireless communication device, such as a smartphone. The smartphone of FIG. 1 is merely one representative example of a device that can be used in conjunction with the systems and methods disclosed herein. Electronic device 100 can correspond to any form of wearable electronic device, a portable media player, a media storage device, a portable digital assistant ("PDA"), a tablet computer, a computer, a mobile communication device, a GPS unit, a remote-control device, or any other electronic device. The electronic device 100 can be referred to as an electronic device, or a consumer device.

The electronic device 100 can have a housing that includes a frame or a band 102 that defines an outer perimeter and a portion of the exterior surface of the electronic device 100. The band 102, or portions thereof, can be joined to one or more other components of the device, as described herein. In some examples, the band 102 can include several sidewall components, such as a first sidewall component 104, a second sidewall component 106, a third sidewall component 108 (opposite the first sidewall component 104), and a fourth sidewall component (not shown in FIG. 1). The aforementioned sidewall components can be joined, for example, at multiple locations, to one or more other components of the device, as described herein. The exterior surface or surfaces defined by the housing, including the surfaces of the band 102 can be treated according to the processes described herein, for example, to form a region having a smaller average grain size than the bulk material of the housing or component. In some examples, the band 102 can include a surface coating or surface finish, as described herein, such as a surface coating deposited by a physical vapor deposition process.

In some instances, some of the sidewall components form part of an antenna assembly (not shown in FIG. 1). As a result, a non-metal material or materials can separate the sidewall components of the band 102 from each other, in order to electrically isolate the sidewall components. For example, a first separating material 112 separates the first sidewall component 104 from the second sidewall component 106, and a second separating material 114 separates the second sidewall component 106 from the third sidewall component 108. The aforementioned materials can include an electrically inert or insulating material(s), such as plastics and/or resin, as non-limiting examples. Further, as described herein, one or more of the sidewall components can be electrically connected to internal components of the electronic device, such as a support plate, as described herein. In some examples, these electrical connections can be achieved by joining a sidewall component to an internal component, for example, as part of the antenna assembly.

The electronic device 100 can further include a display assembly 116 (shown as a dotted line) that is covered by a protective cover 118. The display assembly 116 can include multiple layers (discussed below), with each layer providing a unique function. The display assembly 116 can be partially covered by a border 120 or a frame that extends along an outer edge of the protective cover 118 and partially covers an outer edge of the display assembly 116. The border 120 can be positioned to hide or obscure any electrical and/or mechanical connections between the layers of the display assembly 116 and flexible circuit connectors. Also, the border 120 can include a uniform thickness. For example, the border 120 can include a thickness that generally does not change in the X- and Y-dimensions.

Also, as shown in FIG. 1, the display assembly 116 can include a notch 122, representing an absence of the display assembly 116. The notch 122 can allow for a vision system that provides the electronic device 100 with information for object recognition, such as facial recognition. In this regard, the electronic device 100 can include a masking layer with openings (shown as dotted lines) designed to hide or obscure the vision system, while the openings allow the vision system to provide object recognition information. The protective cover 118 can be formed from a transparent material, such as glass, plastic, sapphire, or the like. In this regard, the protective cover 118 can be referred to as a transparent cover, a transparent protective cover, or a cover glass (even though the protective cover 118 sometimes does not include glass material). As shown in FIG. 1, the protective cover 118 includes an opening 124, which can represent a single opening of the protective cover 118. The opening 124 can allow for transmission of acoustical energy (in the form of audible sound) into the electronic device 100, which can be received by a microphone (not shown in FIG. 1) of the electronic device 100. The opening 124 can also, or alternatively, allow for transmission of acoustical energy (in the form of audible sound) out of the electronic device 100, which can be generated by an audio module (not shown in FIG. 1) of the electronic device 100.

The electronic device 100 can further include a port 126 designed to receive a connector of a cable assembly. The port 126 allows the electronic device 100 to communicate data (send and receive), and also allows the electronic device 100 to receive electrical energy to charge a battery assembly. Accordingly, the port 126 can include terminals that electrically couple to the connector.

The electronic device 100 can also include several additional openings. For example, the electronic device 100 can include openings 128 that allow an additional audio module (not shown in FIG. 1) of the electronic device to emit acoustical energy out of the electronic device 100. The electronic device 100 can further include openings 132 that allow an additional microphone of the electronic device to receive acoustical energy. Furthermore, the electronic device 100 can include a first fastener 134 and a second fastener 136 designed to securely engage with a rail that is coupled to the protective cover 118. In this regard, the first fastener 134 and the second fastener 136 are designed to couple the protective cover 118 with the band 102.

The electronic device 100 can include several control inputs designed to facilitate transmission of a command to the electronic device 100. For example, the electronic device 100 can include a first control input 142 and a second control input 144. The aforementioned control inputs can be used to adjust the visual information presented on the display assembly 116, or the volume of acoustical energy output by an audio module, as non-limiting examples. The controls can include one of a switch or a button designed to generate a command or a signal that is received by a processor. The control inputs can at least partially extend through openings in the sidewall components. For example, the second sidewall component 106 can include an opening 146 that receives the first control input 142. Further details regarding the features and structure of an electronic device are provided below, with reference to FIG. 2.

Figure 2:
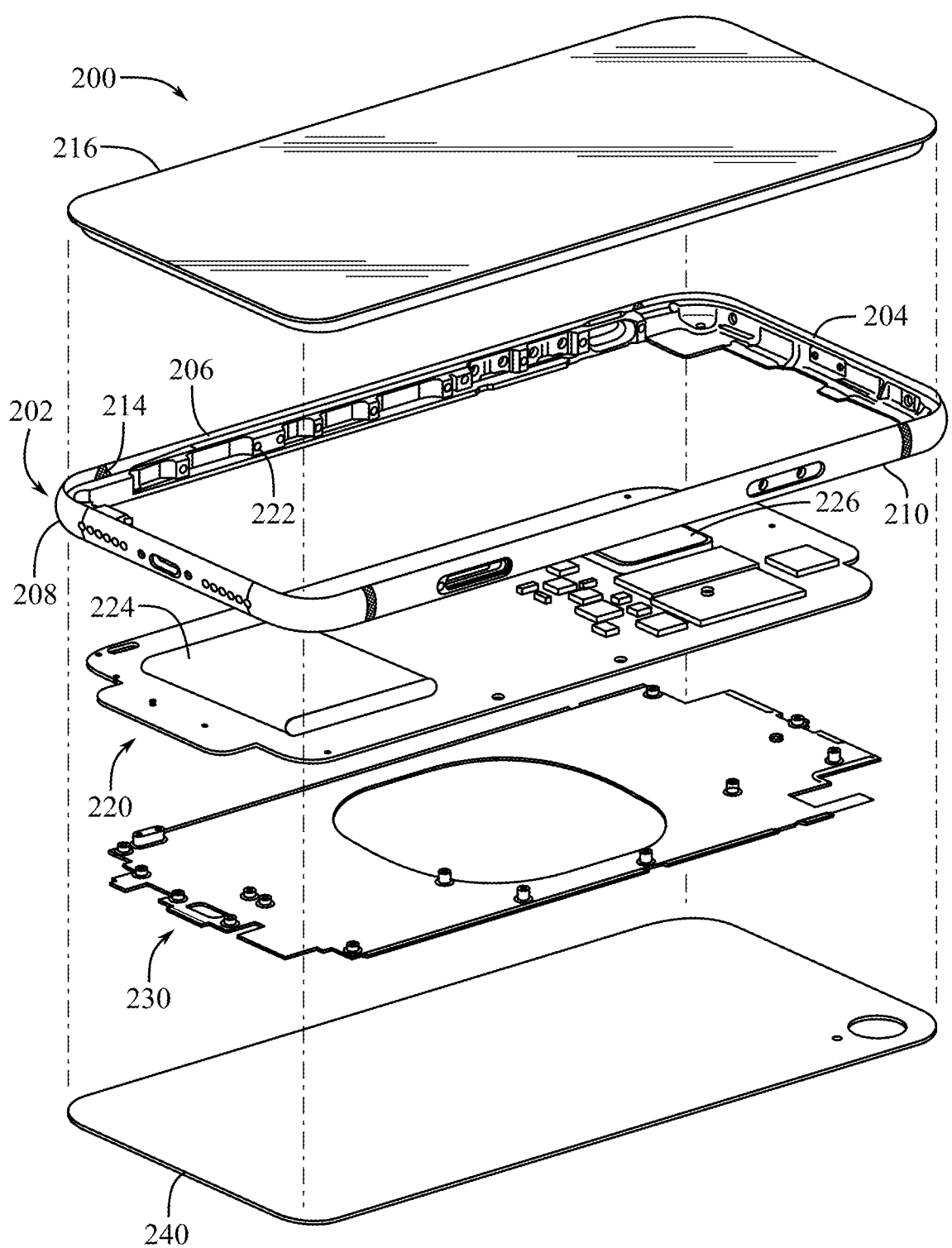
FIG. 2 shows an exploded perspective view of an electronic device.

FIG. 2 illustrates an exploded view of an electronic device 200. The electronic device 200 shown in FIG. 2 is a smartphone, but is merely one representative example of a device that can include or be used with the systems and methods described herein. As described with respect to electronic device 100, electronic device 200 can correspond to any form of wearable electronic device, a portable media player, a media storage device, a portable digital assistant ("PDA"), a tablet computer, a computer, a mobile communication device, a GPS unit, a remote-control device, and other similar electronic devices. In some examples, the electronic device 200 can include some or all of the features described herein with respect to electronic device 100.

The electronic device can have a housing that includes a band 202 that at least partially defines an exterior portion, such as an outer perimeter, of the electronic device. As with the band 102 described above in FIG. 1, the band 202 can include several sidewall components, such as a first sidewall component 204, a second sidewall component 206, a third sidewall component 208 (opposite the first sidewall component 204), and a fourth sidewall component 210. The band 202 can also include a non-metal material or materials that separate and/or join the sidewall components of the band 202 with each other, as described herein. For example, separating material 214 can separate and/or join the second sidewall component 206 with the third sidewall component 208. In some other instances, however, the band 202 may not include any separating material 214 and can be a solid and substantially unitary metallic component such that the sidewall components 204, 206, 208, and 210 are a single body.

The housing, including the band 202, can include one or more features to receive or couple to other components of the device 200. For example, the band 202 can include any number of features such as apertures, cavities, indentations, and other mating features to receive and/or attach to one or more components of the device 200. The electronic device 200 can include internal components such as processors, memory, circuit boards, batteries, and sensors. Such components can be disposed within an internal volume defined, at least partially, by the band 202, and can be affixed to the band 202, via internal surfaces, attachment features, threaded connectors, studs, posts, and/or other fixing features, that are formed into, defined by, or otherwise part of the band 202. For example, attachment feature 222 can be formed in the band 202. In some examples, the attachment feature 222 can be formed by a subtractive process, such as machining. Accordingly, the portion of the band 202 where the attachment feature 222 is to be formed may not be subjected to a treatment or include a refined microstructure as described herein, to allow for relative ease of formation of the feature 222.

The device 200 can include internal components, such as a system in package (SiP) 226, including one or more integrated circuits such as a processors, sensors, and memory. The device 200 can also include a battery 224 housed in the internal volume of the device 200. The device 200 can also include one or more sensors, such as optical or other sensors, that can sense or otherwise detect information regarding the environment exterior to the internal volume of the device 200. Additional components, such as a haptic engine, can also be included in the device 200. The electronic device 200 can also include a display assembly 216, similar to display assembly 116, described herein. In some examples, the display assembly 216 can be received by and/or be attached to the band 202 by one or more attachment features. In some examples, one or more of these internal components can be mounted to a circuit board 220. The electronic device 200 can further include a support plate 230, also referred to as a back plate or chassis, that can provide structural support for the electronic device 200. The support plate 230 can include a rigid material, such as a metal or metals.

An exterior surface of the electronic device 200 can further be defined by a back cover 240 that can be coupled to one or more other components of the device 200. In this regard, the back cover 240 can combine with the band 202 to form an enclosure or housing of the electronic device 200 with the enclosure or housing (including band 202 and back cover 240) at least partially defining an internal volume and an exterior surface. The back cover 240 can include a transparent material such as glass, plastic, sapphire, or the like. In some examples, the back cover 240 can be a conductive transparent material, such as indium titanium oxide or a conductive silica. The exterior surface or surfaces defined by the housing, including the surfaces of the band 202 and/or the back cover 240, can be subjected to a treatment as described herein and can include a region or regions having the refined microstructure and properties described herein. As such, the band 202 and the back cover 240 can be formed from any number of desired materials, such as metallic materials. In some examples, other components, such as internal components of the electronic device 200, for example a support plate 230, can also be subjected to a treatment as described herein and can include a region having a refined microstructure as described herein. Further details regarding coating a component of an electronic device are provided below with reference to FIG. 3.

Figure 3:
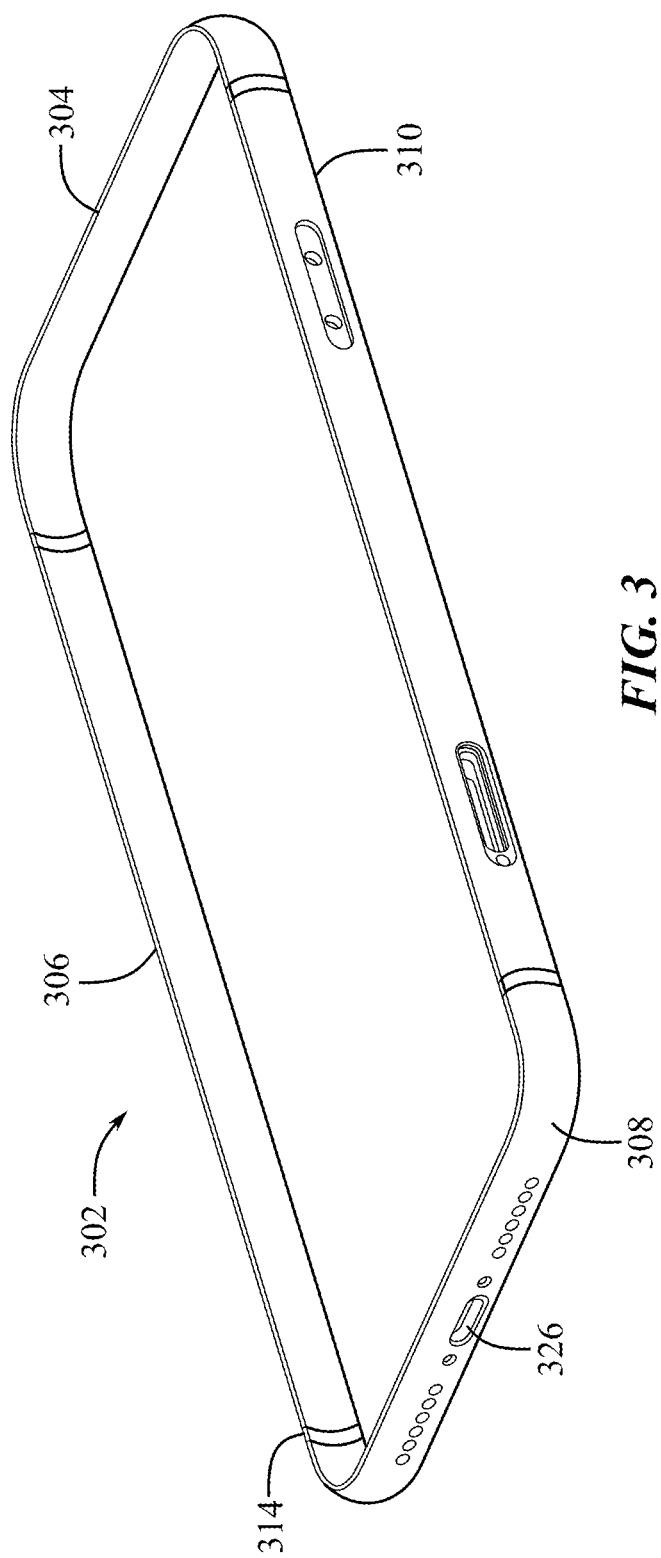
FIG. 3 shows a perspective view of a component of an electronic device.

FIG. 3 illustrates a component 302 of an electronic device. The electronic device can be a smartphone, and can include any of the features of devices 100 and 200, as described with respect to FIGS. 1 and 2. The component 302 can be a band 302 of a smartphone, similar to band 102 and band 202 described with respect to FIGS. 1 and 2. As with bands 102 and 202, the band 302 can include several sidewall components, 304, 306, 308, and 310, or in some examples, can be a substantially unitary body. In embodiments where the band 302 includes sidewall components 304, 306, 308, 310, they can be joined together by a material 314. The material 314 can be any material as desired, for example, a non-conductive material such as a non-conductive polymer. In some examples, as described herein, the components 304, 306, 308, 310 can be integrated with or joined by the material 314 prior to being subjected to a treatment, as described herein, without the treatment degrading or undesirably affecting the material 314. One or more components 304, 306, 308, 310 can also include features formed therein, for example, an aperture 326 formed in component 308.

The band 302 can include or be formed from a metallic material, such as aluminum, titanium, or stainless steel. For example, the sidewall components 304, 306, 308, 310 forming the band 302 can include a stainless steel alloy, for example a 316 L stainless steel alloy. The band 302 and the sidewall components 304, 306, 308, 310 can also include a surface coating, such as a coating deposited by a physical vapor deposition process, as described herein. In some examples, the band can include one or more regions, such as regions that define an exterior surface of the electronic device, that include a refined microstructure, as described herein. In some embodiments, an entire surface of the band 302 can have a refined microstructure, as described herein, for example, having a grain size distribution including smaller grains at the surface of the band and transitioning along a gradient to larger grains near to the interior of the band material.

Accordingly, an electronic device including the band 302 can have a portion or portion including the refined microstructure described herein, for example, including a first region extending from the surface to a depth and having a first average grain size, and a second region extending from the first region further into the portion and having a second, larger average grain size. In some examples, the first region can include a grain size distribution transitioning from an average grain size at the surface to a larger average grain size at a portion of the first region adjacent to the second region. Further, in some examples, multiple components or portions of components can include a refined microstructure, as described herein, formed according to the processes described herein.

Any number or variety of electronic device components can include a component that has been subjected to a surface treatment, as described herein. The surface treatment or treatments can refine or modify a microstructure of some or all of the component, can densify or reduce the porosity of some or all of the component, and/or can align or reduce gaps between portions of the component. One or more of these surface treatments can include plastically deforming the surface to a desired depth, and/or applying a desired amount of pressure to the surface, as described herein. The component can then be treated, for example, by polishing or forming a surface layer. Various examples of components having been subjected to surface treatments as described herein, surface coatings, and processes for forming the same are described below with reference to FIGS. 4 and 5.

Figure 4:
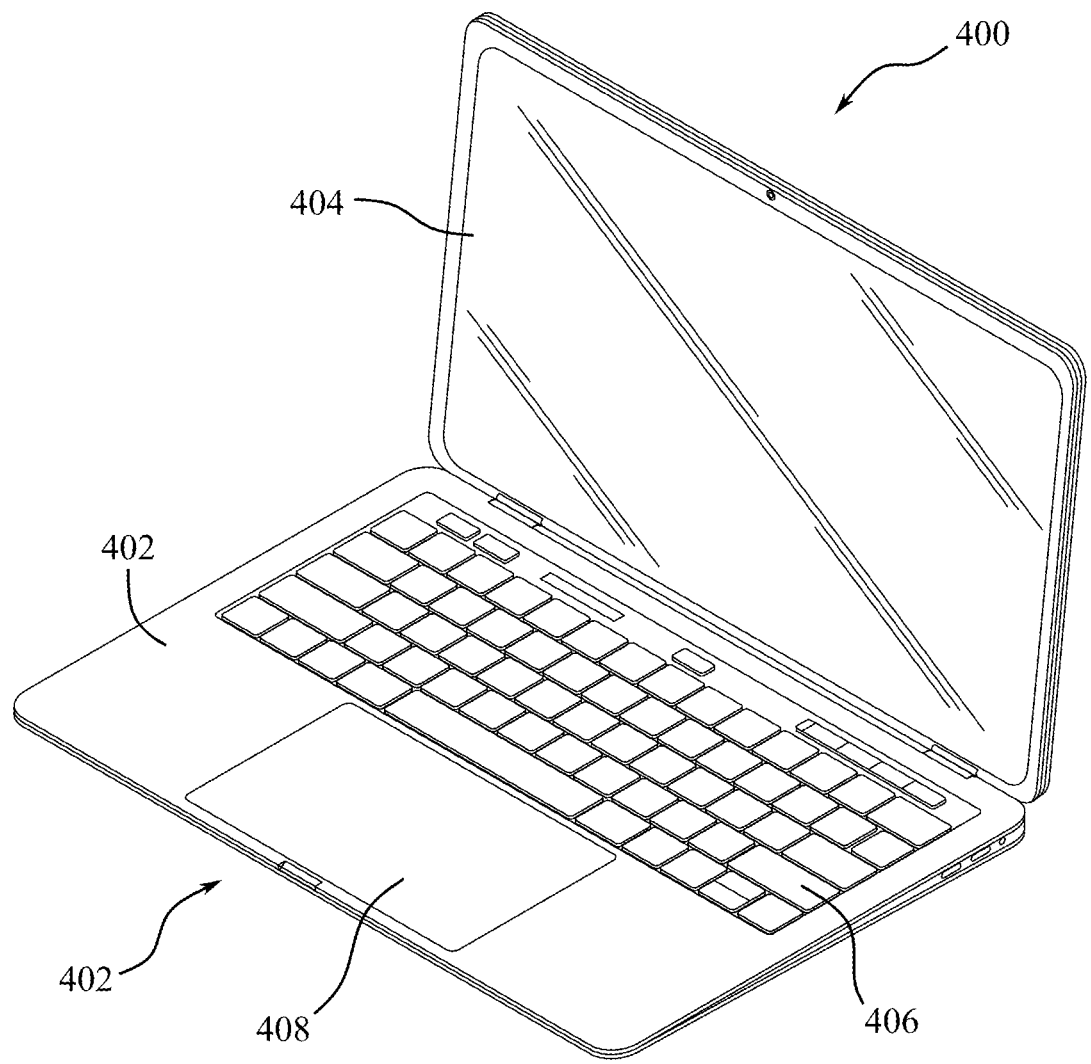
FIG. 4 shows a top perspective view of a perspective view of an electronic device.

FIG. 4 shows another electronic device 400. The electronic device shown in FIG. 4 is a laptop computer. As with electronic devices 100 and 200 discussed herein, the laptop computer 400 of FIG. 4 is merely one representative example of a device that can be used in conjunction with the components and methods disclosed herein. Electronic device 400 can correspond to any form of electronic device, such as a wearable electronic device, a portable media player, a media storage device, a portable digital assistant ("PDA"), a tablet computer, a computer, a mobile communication device, a GPS unit, or a remote-control device. The electronic device 400 can be referred to as an electronic device, or a consumer device. The electronic device 400 can have an exterior housing 402, a display 404, and input components 406, 408. Further details of the electronic device 400 are provided below with reference to FIG. 5.

Figure 5:
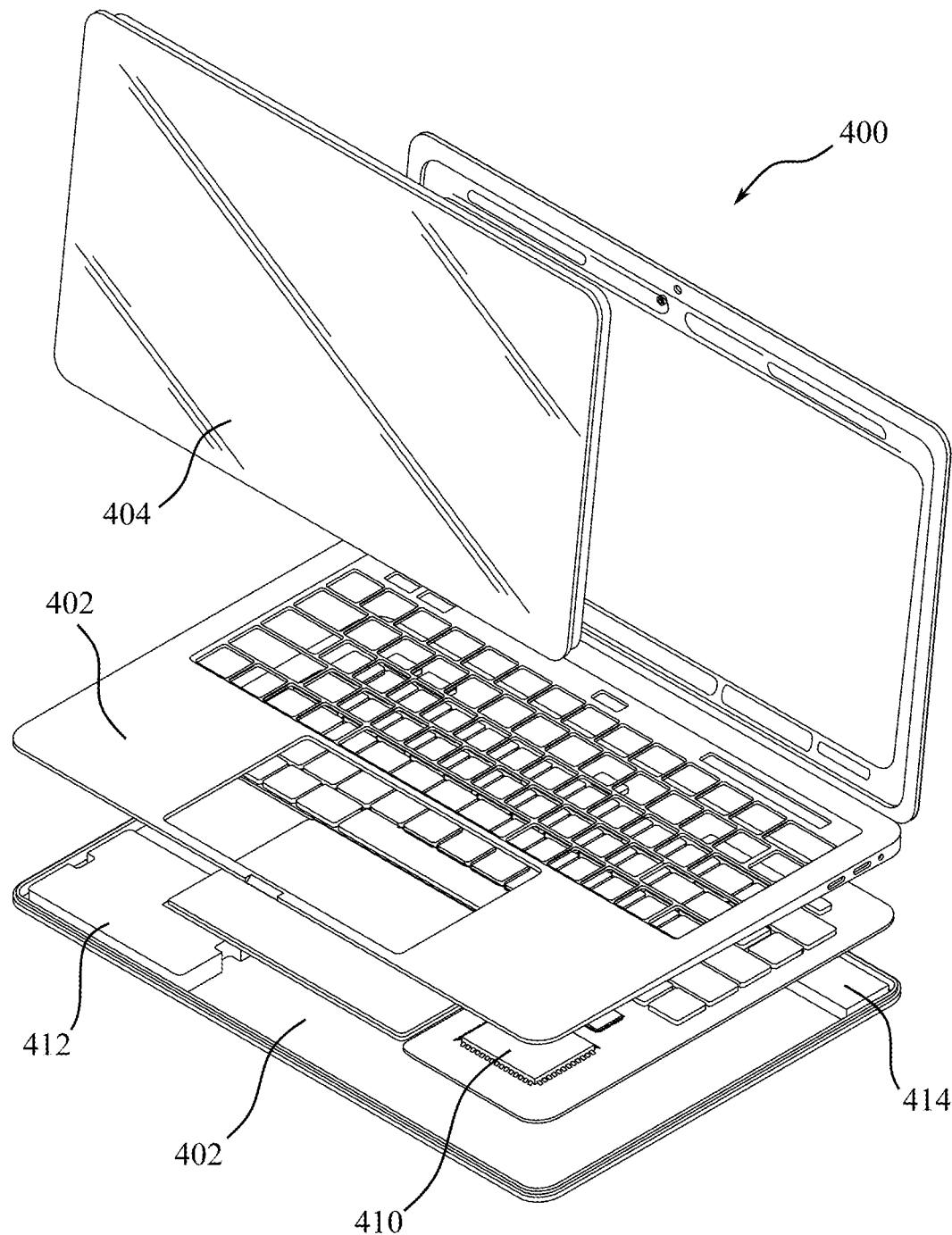
FIG. 5 shows an exploded view of an electronic device.

Referring now to FIG. 5, the electronic device 400 can include a housing 402 that at least partially defines an exterior surface of the device 400. The device 400 can also include internal components, such as processors 410, memory, circuit boards, batteries 412, sensors 414, speakers, and other internal computing components. Such components can be disposed within an internal volume defined at least partially by the housing 402, and can be affixed to the housing 402 via internal surfaces, attachment features, threaded connectors, studs, posts, and/or other features, that are formed into, extending into the body from, or otherwise part of the housing 402.

As with the housings of electronic devices 100 and 200, the housing 402 can be formed from substantially any metallic material, for example aluminum, steel, titanium, or other metals described herein. In some embodiments, the housing 402 can further include a surface layer or coating formed over the metallic material, such as a layer deposited by a physical vapor deposition process. Thus, in some examples, the housing 402 can have a desired refined microstructure, and a desired hardness or hardness profile, as described herein. Additionally, other components of the electronic device 400 can include a refined microstructure, as described herein. In some examples, substantially any portion or entire exterior surface of a component, such as the housing 402, can have a refined microstructure, as described herein. Accordingly, the portion on which a treatment is carried out and which includes a refined microstructure as described herein can be any three-dimensional surface. That is, the portion including the refined microstructure described herein is not required to be planar and can include curves, protrusions, folds, corners, bends, or any other three-dimensional features. In some examples, a three-dimensional surface can be a surface that has an amount of curvature or is non-planer in two or more orientations.

Any number or variety of electronic device components can include a component that has been subjected to a surface treatment, as described herein. The surface treatment or treatments can refine or modify a microstructure of some or all of the component, can densify or reduce the porosity of some or all of the component, and/or can align or reduce gaps between portions of the component. One or more of these surface treatments can include plastically deforming the surface to a desired depth, and/or applying a desired amount of pressure to the surface, as described herein. The component can then be treated, for example, by polishing or forming a surface layer. Various examples of components having been subjected to surface treatments as described herein, surface coatings, and processes for forming the same are described below with reference to FIGS. 6 and 7.

Figure 6:
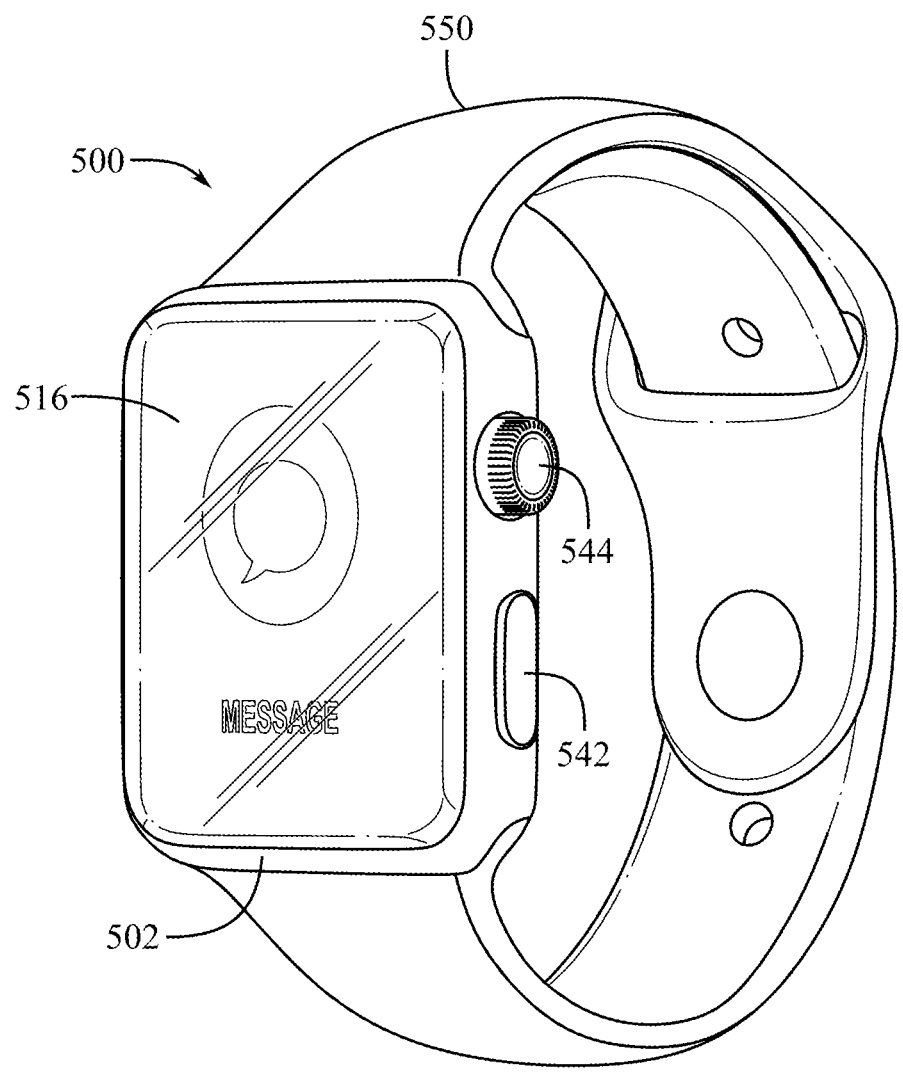
FIG. 6 shows a front perspective view of an electronic device.

FIG. 6 shows another embodiment of an electronic device 500. The electronic device shown in FIG. 6 is a watch, such as a smartwatch. The smartwatch 500 of FIG. 6 is merely one representative example of a device that can be used in conjunction with the components and methods disclosed herein. As described with respect to electronic devices 100, 200, 400, electronic device 500 can correspond to any form of wearable electronic device, a portable media player, a media storage device, a portable digital assistant ("PDA"), a tablet computer, a computer, a mobile communication device, a GPS unit, a remote control device, and other devices. The electronic device 500 can be referred to as an electronic device, or a consumer device. Further details of the watch 500 are provided below with reference to FIG. 7.

Figure 7:
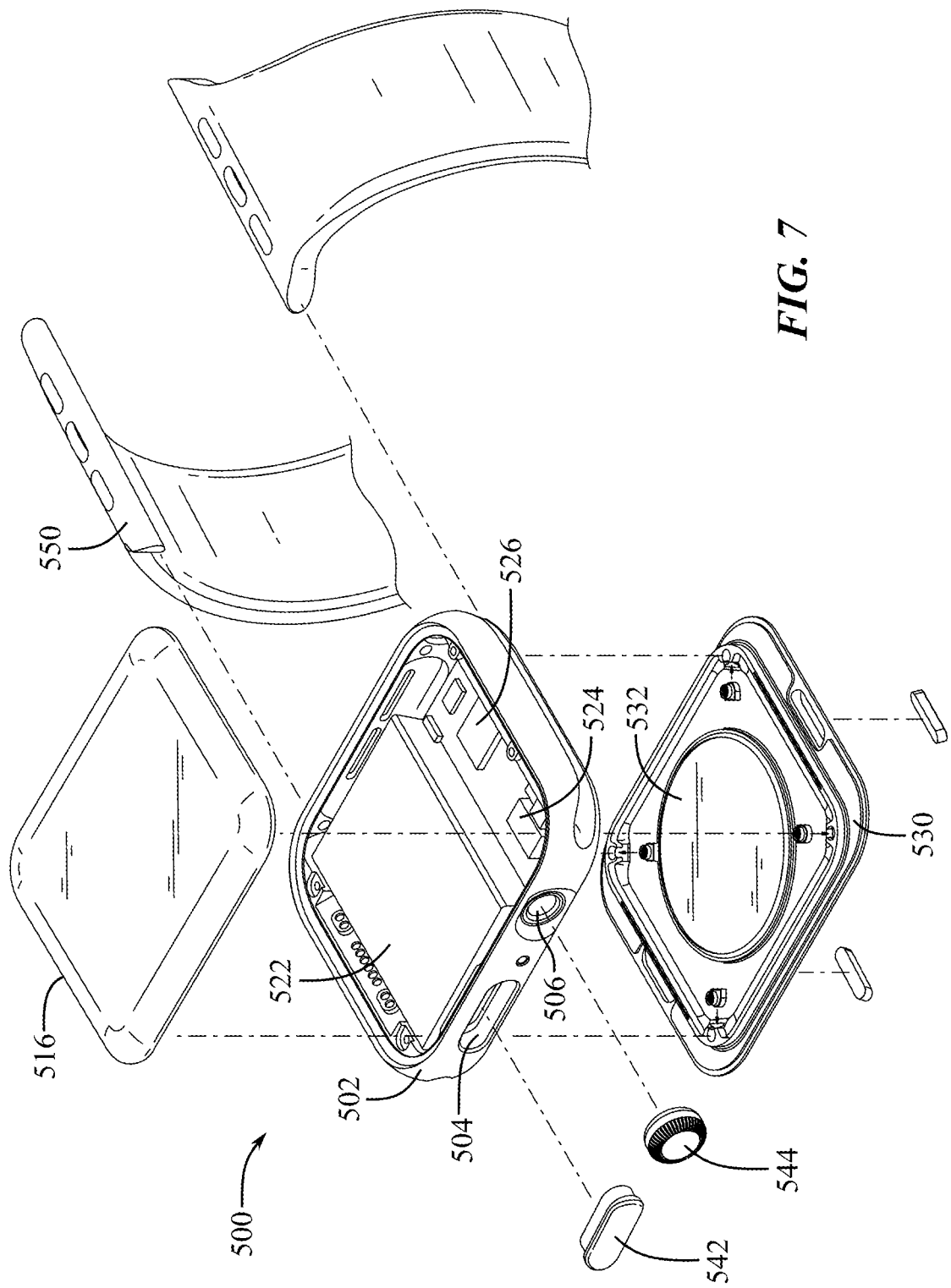
FIG. 7 shows an exploded view of an electronic device.

Referring now to both FIGS. 6 and 7, the electronic device 500 can include a housing 502, and a cover 516 attached to the housing. The housing 502 can substantially define at least a portion of an exterior surface of the device 500. The cover 516 can include glass, plastic, or any other substantially transparent material, component, or assembly. The cover 516 can cover or otherwise overlay a display, a camera, a touch sensitive surface, such as a touchscreen, or other component of the device 500. The cover 516 can define a front exterior surface of the device 500. A back cover 530 can also be attached to the housing 502, for example opposite the cover 516. The back cover 530 can include ceramic, plastic, metal, or combinations thereof. In some examples, the back cover 530 can include an electromagnetically transparent portion 532. The electromagnetically transparent portion 532 can be transparent to any wavelength of electromagnetic radiation, such as visual light, infrared light, radio waves, or combinations thereof. Together, the housing 502, cover 516, and back cover 530 can substantially define an interior volume and exterior surface of the device 500.

As with the housing 100, 200, and 400, the housing 502 can be formed from a metallic material and can include a portion or portions having the refined microstructure described herein. The portions, for example the portions of the housing 502 at least partially defining the exterior surface of the device 500, can include a first region extending from the surface to a desired depth having a first average grain size, and a second region extending from the first region into the housing 502 having a second, larger average grain size. The grains of the first region can have sizes distributed along a gradient, transitioning from smaller grains at the surface to larger grains at the portion of the first region adjacent to the second region. In some examples, the housing 502 can also include a surface layer formed by a physical vapor deposition process.

The housing 502 can be a substantially continuous or unitary component and can include one or more openings 504, 506 to receive components of the electronic device 500 and/or provide access to an internal portion of the electronic device 500. Additionally, other components of the electronic device 500, can be formed from or can include a metallic material including a portion or portions having the refined microstructure described herein. In some embodiments, the device 500 can include input components such as one or more buttons 542 and/or a crown 544 that can be formed from a metallic material including a portion or portions having the refined microstructure described herein. The metallic material including a portion or portions having the refined microstructure described herein can provide for strong and durable input components 542, 544 as discussed herein.

The electronic device 500 can further include a strap 550, or other component designed to attach the device 500 to a user, or to provide wearable functionality. In some examples, the strap 550 can be a flexible material that can comfortably allow the device 500 to be retained on a user's body at a desired location. Further, the housing 502 can include a feature or features that can provide attachment locations for the strap 550. In some embodiments, the strap 550 can be retained on the housing 502 by any desired techniques. For example, the strap 550 can include any combination of magnets that are attracted with magnets disposed within the housing 502, or retention components that mechanically retain the strap 550 against the housing 502.

The device 500 can also include internal components, such as a haptic engine 524, a battery 522, and a system in package (SiP), including one or more integrated circuits 526, such as processors, sensors, and memory. The SiP can also include a package. All or a portion of one or more internal components, for example the package of the SiP, can be formed from, or can include, a metallic material including a portion or portions having the refined microstructure described herein.

The internal components, such as one or more of components 522, 524, 526 can be disposed within an internal volume defined at least partially by the housing 502, and can be affixed to the housing 502 via internal surfaces, attachment features, threaded connectors, studs, posts, or other features, that are formed into, defined by, or otherwise part of the housing 502 and/or the cover 516 or back cover 530. In some embodiments, the attachment features can be formed relatively easily on interior surfaces of the housing 502, for example, by machining, because those portions of the housing have not been subjected to a surface treatment, as described herein.

The housing 502 formed from a metallic material including a portion or portions having the refined microstructure described herein can be conformable to interior dimensional requirements, as defined by the internal components 522, 524, 526. For example, the structure of the housing 502 can be defined or limited exclusively or primarily by the internal components the housing 502 is designed to accommodate. That is, because a housing 502 formed from a metallic material including a portion or portions having the refined microstructure described herein can be extremely strong, hard, and durable, the housing 502 can be shaped to house the interior components 522, 524, 526 in a dimensionally efficient manner without being constrained by factors other than the dimensions of the components, such as the need for additional structural elements.

Any number or variety of electronic device components can include a component that has been subjected to a surface treatment, as described herein. The surface treatment or treatments can refine or modify a microstructure of some or all of the component, can densify or reduce the porosity of some or all of the component, and/or can align or reduce gaps between portions of the component. One or more of these surface treatments can include plastically deforming the surface to a desired depth, and/or applying a desired amount of pressure to the surface as described herein. The component can then be treated, for example, by polishing or forming a surface layer. Various examples of components having been subjected to surface treatments as described herein, surface coatings, and processes for forming the same are described below with reference to FIGS. 8-11.

FIG. 8 illustrates a cross-sectional view of a portion of a component 600 of an electronic device that has not been subjected to a surface treatment, as described herein. In some embodiments, the component 600 can be a housing of an electronic device and can include some or all of the features of the housings 100, 200, 400 described herein. The component 600 can include or be formed from a metallic material, for example aluminum, steel, titanium, other metals, or alloys thereof. Thus, in some examples, the component 600 can include crystalline grains 602, 604. Each crystalline grain 602, 604 can have a grain size. As used herein, the term grain size refers to the largest diameter or largest linear dimension of an individual crystalline grain. In some instances, such as for grains that may not be substantially spherical, or that may be highly elongated in one or two dimensions, the grain size can refer to an average of any number of diameters of the crystalline grain. Further, a region or regions of the component 600, for example the region illustrated in FIG. 8, can have an average grain size. As used herein, the term average grain size refers to the sum total of the grain size of each grain within the region divided by the total number of grains.

As can be seen, an untreated component 600 including or formed from a metallic material can have grains 602 near the external surface 610 that are substantially the same size as grains 604 in the interior region of the component 600. In some examples, the average grain size of the component 600, including grains 602 and 604, can be greater than 45 nanometers, greater than 46 nanometers, greater than 47 nanometers, greater than 48 nanometers, greater than 49 nanometers, greater than 50 nanometers, greater than 60 nanometers, greater than 75 nanometers, or even 100 nanometers or greater. Accordingly, the mechanical properties of the metallic material forming the component 600 can be substantially similar at the surface 610 and near the interior, for example, adjacent to the grain 604. As described herein, if the metallic material of the component 600 is selected to provide for ease of machinability, the surface 610 may not have a desired level of hardness or durability. Conversely, if the metallic material of the component 600 is selected to provide a desired level of hardness, it will likely be difficult, expensive, and/or time consuming to machine features into the component 600. The surface treatment described herein, however, can allow for a metallic material that has a desired level of machinability, while also providing surface 610 with a desired level of hardness. The component 600 can include any desired shape or form, and can be subjected to a surface treatment, as described herein and as illustrated in FIGS. 9-11.

FIG. 9 shows a cross-sectional view of a portion of a component 700 of an electronic device being subjected to a surface treatment process, also referred to as a burnishing process. In some examples, the component 700 can be substantially similar to the untreated component 600 described with respect to FIG. 8. In some examples, one or more portions of the component 700, for examples portions that are not shown, can be subjected to a similar or identical surface treatment or burnish, as will be described. As such, prior to treatment, the portion of the component 700 depicted in FIG. 9 can have a substantially uniform or regular distribution of grain sizes throughout, again, similar to the grain structure illustrated with respect to component 600 illustrated in FIG. 8.

During a surface treatment process, or burnishing process the contact portion 710 of a tool is brought into contact with a surface 702 of the component 700 at a location where the formation of a first region including refined grains is desired. The contact portion 710 contacts the component 700 at the surface 702 and exerts sufficient force against the component 702 to plastically deform the surface 702 to a desired depth, as illustrated. As used herein, the desired deformation depth can refer to the deformation that occurs locally under the contact portion 710. In some examples, this deformation can cause a protrusion or bulging of the surface 702 adjacent to the contact portion 710, although the contact portion 710 can subsequently contact and deform these areas of the surface 702, as shown in FIGS. 10 and 11.

The contact portion 710 of the tool can plastically deform the surface 702 to a depth of at least 10 microns. In some examples, the contact portion 710 of the tool can plastically deform the surface 702 to a depth of at least 12 microns, at least 15 microns, at least 20 microns, at least 25 microns, at least 30 microns, at least 40 microns, or at least 50 microns or more. Further, in some examples, the depth to which the contact portion 710 plastically deformed the surface 702 can be controllably varied at various desired locations. Additionally, the force required to deform the surface 702 to a desired depth may vary at different locations on the surface 702, for example, due to the component geometry, material defects, differences in composition, and other factors. In some examples, the contact portion 710 of the cool can exert a pressure on the surface 702 of the component 700 of between about 1 bar and about 1000 bar, between about 10 bar and about 1000 bar, between about 50 bar and about 500 bar, or between about 100 bar and about 300 bar.

In some examples and as illustrated, the contact portion 710 of the tool can have a substantially rounded shape or profile, such as a spherical, ovoid, or other rounded shape. In some examples, the contact portion 710 can have a cylindrical shape. In some examples, the contact portion 710 can have any shape that can achieve or produce the desired depth of plastic deformation of the surface 702. In some examples, the contact portion 710 can have a shape corresponding to a shape of the surface 702 to be treated. That is, in some examples, the tool can have a contact portion 710 having a profile that matches the surface 702 of the component being treated. In some examples, such as where the contact portion 710 has a spherical or rounded shape, the diameter or width of the contact portion 710 can be between 1 millimeter and 50 millimeters. In some embodiments, the contact portion 710 can be substantially spherical and can have a diameter of 8 millimeters or 10 millimeters.

The area of the surface 702 that directly contacts the contact portion 710 can be referred to as the contact patch or contact area of the tool. The size of this contact area can vary depending on the size of the contact portion 710 and the depth to which the surface 702 is deformed. In some instances, the contact area can be significantly smaller than the diameter or size of the contact portion 710. For example, the contact area can be less than 500 square microns. In some examples, the contact area can be less than 400 square microns, less than 300 square microns, less than 250 square microns, less than 200 square microns, less than 150 square microns, or less than 100 square microns. As used herein, the term contact patch or contact area can refer to the area of the surface 702 directly engaged or contacted by the contact portion 710 when the tool is stationary with respect to the surface 702. Thus, while the contact portion 710 can be translated across the surface 702 and can come into contact with large areas thereof, for example, as illustrated in FIGS. 10 and 11, the contact area is nevertheless defined as the area instantaneously contacted by the contact portion 710 at any given time and location.

The contact portion 710 can, in some embodiments, be integrated or attached to a tool that is compatible with a CNC or other machining apparatus or tool. Accordingly, in some examples, the surface treatment described herein can be integrated into existing process flows for component manufacture or device assembly. Thus, a desired portion of the component 700 can be subjected to a surface treatment without significantly increasing production costs or processing times. Further, the contact portion 710 can be integrated with or used by hardware or apparatuses that can already be used during component 700 manufacture or assembly, again preventing large increases in cost or processing time.

The plastic deformation of the surface 702 caused by the contact portion 710 can produce or result in the formation of a region 704 extending from the surface 702 to a desired depth into the component 700. The crystalline grains of this region 704 can be affected by the contact portion 710 and can be reduced in size such that the area 704 has a smaller average grain size than the adjacent regions of the component 700. Although referred to herein as being reduced in size, without being bound by any one theory, the reducing in average grain size can be due to one or more factors, such as the division of single grains into multiple grains, the formation of new, smaller grains, and other similar grain defining factors.

The region 704 having a reduced average grain size, and/or an average grain size smaller than an adjacent region or regions, also referred to as a first region, can extend a desired depth into the component from the surface 702. In some examples, the region 704 can extend to a depth of at least 100 microns, for example to a depth of 300 microns. In some examples, the region 704 can extend to a depth of at least 150 microns, at least 200 microns, at least 250 microns, at least 300 microns, at least 400 microns, at least 500 microns, at least 600 microns, at least 700 microns, at least 800 microns, at least 900 microns, or even up to 1 mm into the component from the surface 702.

A second region, for example, including unaffected or unrefined grains having an average grain size greater than 45 or 50 nanometers, can be considered to extend from the first region further into the component 700. Accordingly, the second region can extend from the first region 704 through the entire remaining thickness of the component 700 underlying the first region. In some examples, the second region can extend from the first region 704 to a depth at least 100 microns further into the component 700, for example to a depth of 300 microns further into the component 700 than the first region 704. In some examples, the second region can extend to a depth of at least 150 microns further than the first region 704, at least 200 microns, at least 250 microns, at least 300 microns, at least 400 microns, at least 500 microns, at least 600 microns, at least 700 microns, at least 800 microns, at least 900 microns, or 1 mm or deeper than the first region 704. Further, in some examples, the thickness of the component 700 can be less than the depth to which the region 704 extends from the surface 702. That is, in some examples, the region 704 can extend substantially through an entire width or depth of a component 700. While the interaction between the tool 710 and surface 702 of the component 700 is shown at one location in FIG. 9, in some examples the tool can be translated across the surface 702 of the component 700 to refine the grains over an extended portion 704 of the component 700.

In some examples, the region 704 can have an average grain size less than 50 nanometers, for example less than 49 nanometers, less than 48 nanometers, less than 47 nanometers, less than 46 nanometers, less than 45 nanometers, less than 44 nanometers, less than 43 nanometers, less than 42 nanometers, less than 41 nanometers, less than 40 nanometers, less than 35 nanometers, or less than 30 nanometers.

FIG. 10 shows a cross-sectional view of a portion of a component 700 of an electronic device being subjected to a surface treatment process, as described herein. As with the process shown in FIG. 9, in some examples, the contact portion 710 of a tool can contact the surface 702 of a component 700 and plastically deform the surface 702 to a desired depth, thereby forming a region 704 having a smaller average grain size than adjacent and/or untreated regions of the component 700. Further, as shown in FIG. 10, the contact portion 710 can be slid, ground, or otherwise translated against the surface 702, such that it translatably contacts the surface 702, indicated in FIG. 10 with an arrow. In some examples, the contact portion 710 can move at a rate of between about 0.01 meters/minute (m/min) and about 10 m/min. In some examples, the contact portion 710 can move at a rate of between about 0.1 m/min and about 5 m/min, between about 0.5 m/min and about 2.5 m/min, or between about 1 m/min and about 2 m/min, for example about 1.25 m/min.

As the contact portion 710 translates across the surface 702 while in contact therewith, the region 704 is formed below the contact portion 710 to a desired depth. Accordingly, the region 704 can be substantially any desired size or area, and in some examples, can be disposed under substantially any amount of surface 702 of the component 700. Further, the force exerted by the tool on the component 700 can provide additional benefits beyond the formation of the region 704. For example, the force exerted by the tool can straighten or align all or a portion of the component 700 and can ensure that the surface 702 is substantially flat or planar.

FIG. 11 shows a cross-sectional view of a portion of a component 700 of an electronic device being subjected to a surface treatment process, as described herein. Similar to the process illustrated in FIG. 10, the contact portion 710 of the tool can be translated across the surface 702 to form a desired region 704. Whereas the contact portion 710 was slid or ground over the surface 702 in FIG. 10, the process illustrated in FIG. 11 can include rolling the contact portion 710 over the surface 702 to form the region 704. Further, the examples illustrated in FIGS. 10 and 11 can be combined as desired. That is, in some examples, the contact portion 710 can both be slid across the surface 702 at a desired rate and rotated while in contact therewith at a desired rate.

Any number or variety of electronic device components can include a component that has been subjected to a surface treatment, as described herein. The surface treatment or treatments can refine or modify a microstructure of some or all of the component, can densify or reduce the porosity of some or all of the component, and/or can align or reduce gaps between portions of the component. One or more of these surface treatments can include plastically deforming the surface to a desired depth, and/or applying a desired amount of pressure to the surface as described herein. The component can then be treated, for example, by polishing or forming a surface layer. Various examples of components having been subjected to surface treatments as described herein, surface coatings, and processes for forming the same are described below with reference to FIGS. 12-14.

Figure 12:
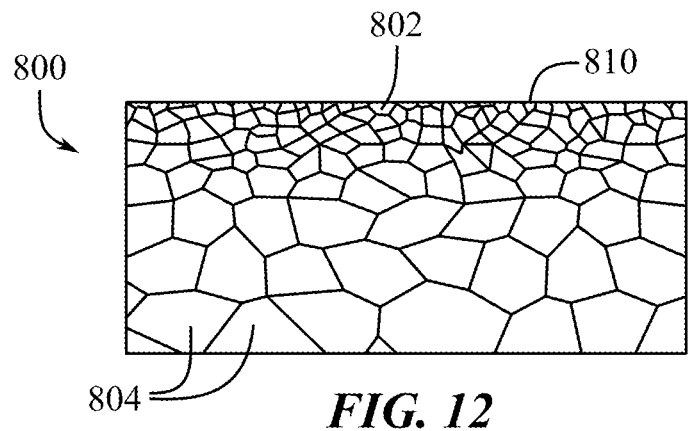
FIG. 12 shows a cross-sectional view of a portion of a component of an electronic device.

FIG. 12 illustrates a cross-section view of a portion 800 of a component of an electronic device after being subjected to a surface treatment, for example region 704 illustrated in FIGS. 9-11, and as described herein. In some examples, the component can be substantially similar and can have a substantially similar grain structure to the untreated component 600 illustrated in FIG. 8. The portion 800 of the component illustrated in FIG. 12 can correspond to the treated region 704 depicted in FIGS. 9-11. Thus, the average grain size of the entire region 800 illustrated in FIG. 12 can be less than 50 nanometers, for example less than 49 nanometers, less than 48 nanometers, less than 47 nanometers, less than 46 nanometers, less than 45 nanometers, less than 44 nanometers, less than 43 nanometers, less than 42 nanometers, less than 41 nanometers, less than 40 nanometers, less than 35 nanometers, less than 30 nanometers, or even smaller. Even though the average grain size of the entire region 800 illustrated in FIG. 12, for example extending from the surface 810 to a desired depth into the component, can be less than a desired size, such as 45 nanometers, the grains can be distributed along a grain size gradient with smaller grains 802 adjacent to the surface 810, and larger grains 804 adjacent to a second region having an average grain size larger than, for example, 45 nanometers.

As a result of the modified microstructure and refined grains in the region 800 illustrated in FIG. 12, the affected portion 800 of the component can have a number of modified or desirable material properties. For example, the affected or refined portion 800 can have a significantly increased hardness relative to unaffected or untreated portions of the component. In some embodiments, the component can include or be formed from a stainless steel alloy, such as 316 L stainless steel. The hardness of 316 L stainless steel that has not been subjected to a treatment as described herein can be about 2 GPa. The region 800 including a refined microstructure, as described herein, however, can have a hardness that is greater than 3 GPA, greater than 3.5 GPa, greater than 4 GPa, 5 GPa, or even up to 6 GPa. Thus, in some embodiments, a refined microstructure region 800 of a component can have a hardness that is 1.5 times, 2 times, or even up to 3 times harder than an untreated portion of the component or material.

In addition to increasing the hardness of the material in the region 800, other material properties of the region 800 can be improved relative to untreated or unaffected portions of the component, as desired. In some examples the corrosion resistance and open circuit pitting potential of the material in region 800 can be improved, relative to the untreated or unaffected portions of the component. For example, the open circuit potential, or critical crevice potential of the region 800 can be higher or more positive than the untreated or unaffected portions of the component. In some examples, the open circuit potential of the region 800 can be up to 10 millivolts (mV), 25 mV, 50 mV, 100 mV, 200 mV, 500 mV, 1V, 2V, or even 5V or more than the open circuit potential of the untreated or unaffected portions of the component in an electrolytic solution.

Further, the treatment to refine the grains of the component in the region 800 can achieve this result without imparting undesirable properties to the region 800 or the component. For example, some traditional techniques for refining the grains of a material, such as shot peening, can result in a rough surface. This rough surface can often demand additional processing in order to achieve a desired level of smoothness, and in some examples, such processing can even result in the removal of significant portions of the region 800. Accordingly, in some examples, the surface 810 of the component can have a surface roughness less than 0.5 microns, less than 0.25 microns, less than 0.1 microns, or even smaller, for example about 0.08 microns. In some cases, the surface roughness of the surface 810 can be less than 0.05 microns or smaller.

The refined microstructure described herein can also be achieved without the formation of additional material phases that can impart undesirable properties to the component. In some examples, the untreated portions of the component can have a first magnetic permeability. Subsequent to a refining treatment, as described herein, the treated portion 800 can have a magnetic permeability that is substantially similar or identical to the untreated component. For instance, where the component includes a stainless steel alloy having a magnetic permeability of $1.05\mu$ in its untreated or unrefined form, the treated region 800 including an average grain size less than 45 nm can have a magnetic permeability of $1.05\mu$.

In some instances, this can be because no magnetic phases have been formed in the material during treatment. For example, where an untreated component can include less than about 1 volume percent of a martensitic phase, the treated region 800 can similarly include less than 1 volume percent of a martensitic phase. In some examples, the region 800 can include less than 1 volume percent of a martensitic phase, less than 0.8 volume percent of a martensitic phase, less than 0.6 volume percent of a martensitic phase, less than 0.4 volume percent of a martensitic phase, less than 0.2 volume percent of a martensitic phase, or even about 0.1 volume percent of a martensitic phase.

Figure 13:
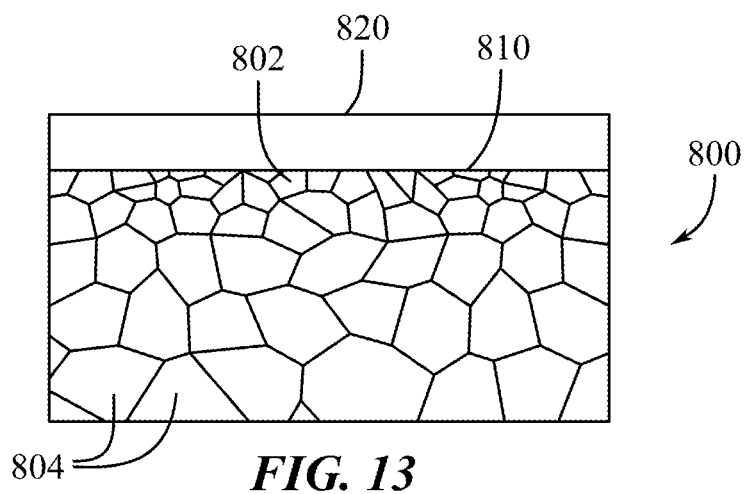
FIG. 13 shows a cross-sectional view of a portion of a component of an electronic device.

The component including a refined grain structure in a region 800 can be subjected to additional subsequent treatment or processing, as described herein. FIG. 13 shows a cross-sectional view of a portion or region 800 of a component of an electronic device having an average grain size less than 45 nanometers, for example after being treated by a surface treatment process, as described herein. In this example, an additional layer 820 of material has been deposited or formed over the surface 810. In some embodiments, the surface 810 can have a small enough surface roughness to deposit or form the layer 820 without additional processing. In some other embodiments, however, the surface 810 can be subjected to additional treatment or processing, for example, to smooth the surface 810 prior to formation of the layer 820. In some examples, the layer 820 can be formed by a vapor deposition process, such as a physical vapor deposition process or a chemical vapor deposition process. In some examples, the layer 820 can have any desired thickness, and can be up to 10 microns, 20 microns, 50 microns, 100 microns, 250 microns, 500 microns, or more in thickness. In some examples, the layer 820 can include a ceramic material, such as a carbide, a nitride, or a carbonitride. In some examples, the layer 820 can include titanium carbonitride, chromium carbonitride, or combinations thereof.

Figure 14:
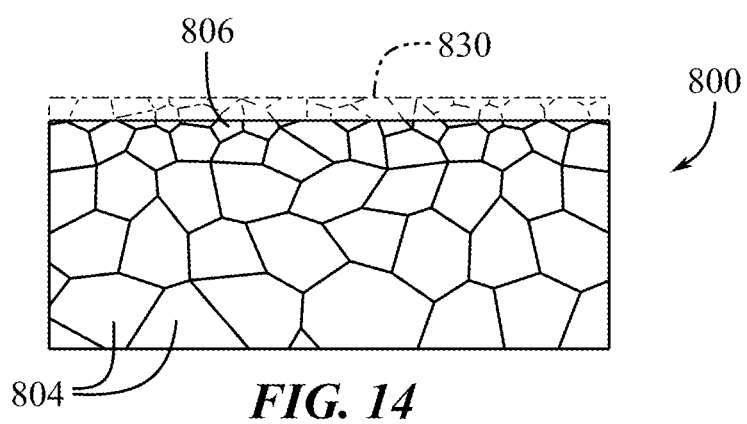
FIG. 14 shows a cross-sectional view of a portion of a component of an electronic device.

FIG. 14 shows a cross-sectional view of a portion or region 800 of a component of an electronic device having an average grain size less than 45 nanometers, for example, after being treated by a surface treatment process, as described herein. Traditional techniques for surface hardening or surface materials, such as shot peening, can only affect the material to depths of about 20 microns, whereas polishing processes can remove up to about 50 microns of material from the surface. Accordingly, such polishing can remove substantially all of the treated portion of a component, thereby obviating any benefit of the treatment. In this example, however, because the region 800 extends into the component at least about 100 microns, and in some examples up to 1 millimeter, the component can be subjected to a polishing treatment to achieve both a desired surface smoothness and a desired cosmetic appearance without obviating the benefit of the treatment. In some examples, the polishing treatment can be a mechanical polishing treatment, a chemical polishing treatment, or combinations thereof. In some examples, such polishing treatments can remove a portion of surface material 830 that can extend up to 10 microns, up to 25 microns, or even up to 50 microns into the component. Even with this surface portion 830 removed by polishing, the grains 806 now present at the surface have still been refined, and the average grain size of the region 800 can still be less than about 45 nanometers.

Any number or variety of electronic device components can include a component that has been subjected to a surface treatment, as described herein. The surface treatment or treatments can refine or modify a microstructure of some or all of the component, can densify or reduce the porosity of some or all of the component, and/or can align or reduce gaps between portions of the component. One or more of these surface treatments can include plastically deforming the surface to a desired depth, and/or applying a desired amount of pressure to the surface as described herein. The component can then be treated, for example, by polishing or forming a surface layer. Various examples of components having been subjected to surface treatments as described herein, surface coatings, and processes for forming the same are described below with reference to FIGS. 15A-16B.

Figure 15A:
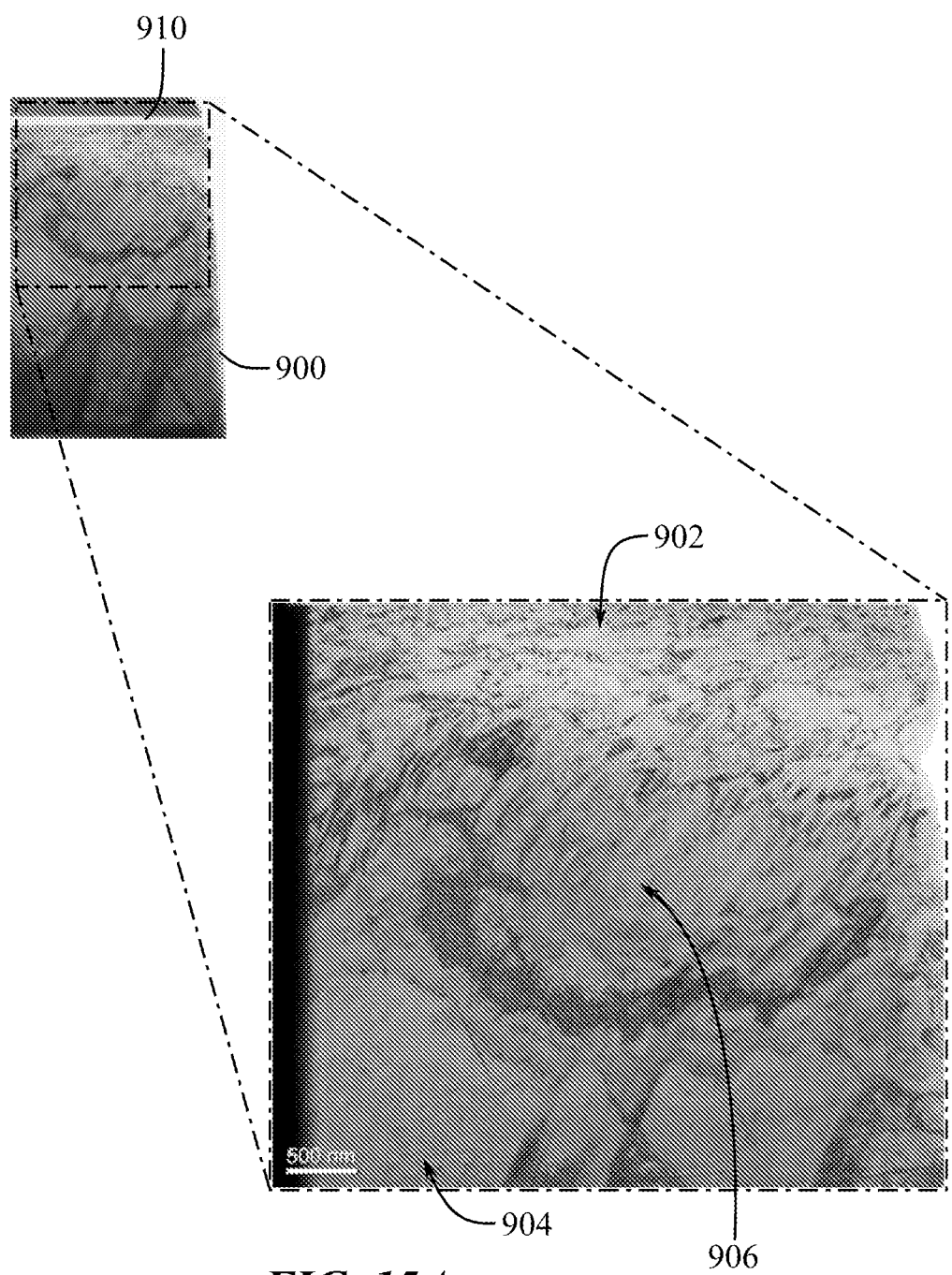
FIG. 15A shows a cross-sectional transmission electron micrograph of a portion of a sample component of an electronic device.

FIG. 15A shows a cross-sectional transmission electron micrograph of a portion of a sample component 900 including a 316 L alloy of stainless steel that has been subjected to a process for forming a refined microstructure, as described herein. The process was substantially similar to the processes illustrated and described with respect to FIGS. 9-11. In this particular example, the contact portion was translated from left to right across the surface 910 of the sample 900. The contact portion exerted a pressure on the surface 910 of the component 900 of about 100 bar and was translated at a rate of about 1.25 meters/minute.

As can be seen, and as described with respect to FIG. 12, the sample component 900 can include smaller compressed grains 902 that are adjacent to the surface 910 and relatively larger and relatively uncompressed grains 904 that are disposed below the grains 902. The compressed grains 902 adjacent to the surface 910 can have a horizontal layered structure and can have a thickness or height as illustrated of less than about 50 nm, for example between about 10 nm and about 50 nm. The grains 902 can have a substantially planar, platelet or pancake like shape, with the length and width of the grains 902 being much larger than the thickness or height of the grains 902. The grains 902 can extend to a depth of about 1 to 2 microns below the surface 910.

Further, as can be seen, the sample component 900 can include intermediate grains 906 that can be disposed between the grains 902 and the grains 906. These intermediate grains can have an elongated tubular structure and can extend at an angle relative to the surface 910. That is, the elongated tubular grains 906 can be oriented with their longest dimension at an angle of less than 90 degrees and greater than 0 degrees relative to the surface 910.

Figure 15B:
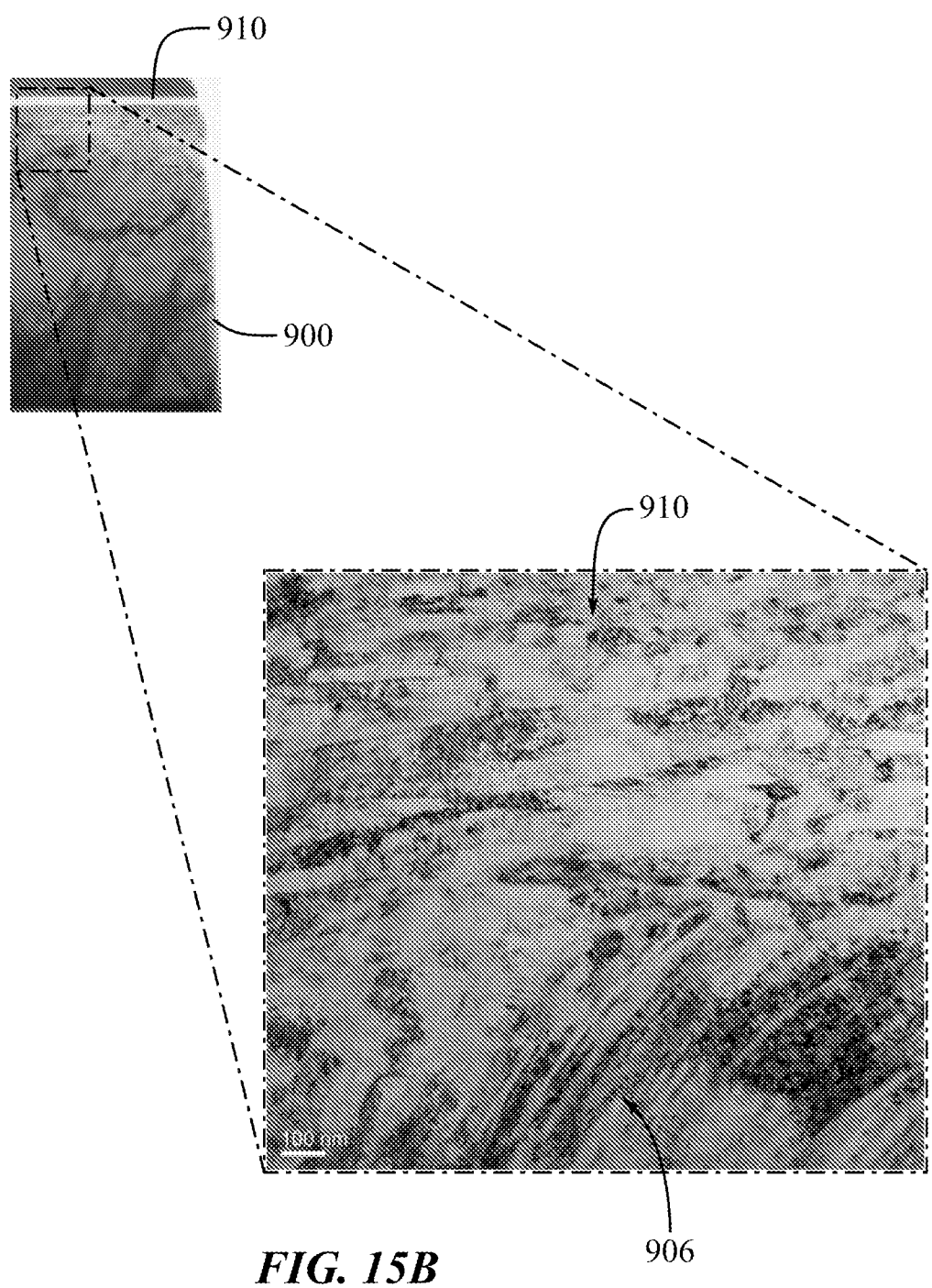
FIG. 15B shows a cross-sectional transmission electron micrograph of a portion of the sample component of FIG. 15A.

FIG. 15B shows a cross-sectional transmission electron micrograph of a portion of the sample component 900 of FIG. 15A. This particular transmission electron micrograph shows a close-up of the compressed grains 902 and the elongated tubular grains 906 described herein. As can be seen, the compressed grains can have a length of about 100 nm to 1000 nm, with substantially smaller thicknesses of about 10 nm to about 50 nm. The width of the grains 902, although not shown, can be similar to or less than the length, that is about 100 nm to 1000 nm.

Figure 15C:
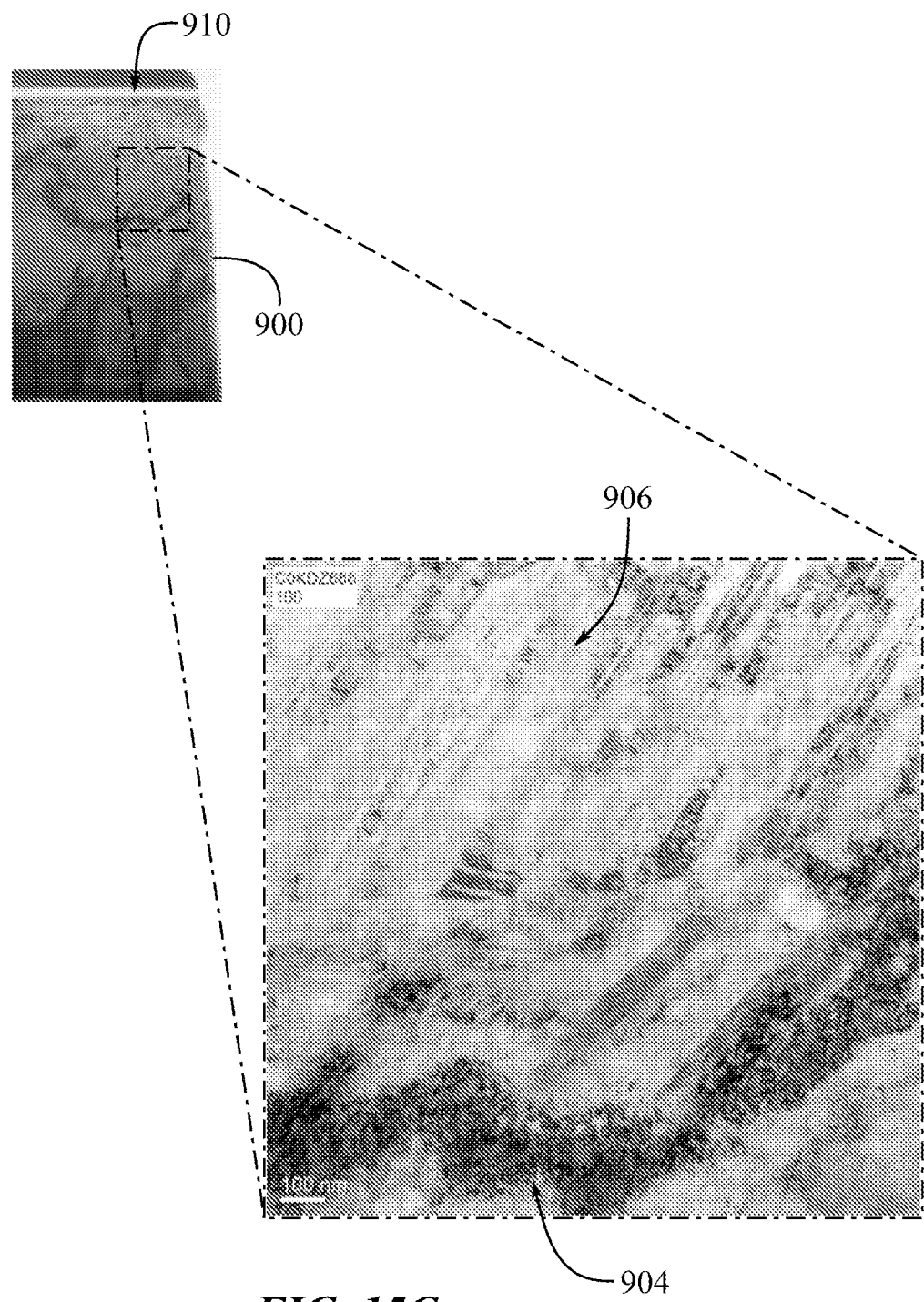
FIG. 15C shows a cross-sectional transmission electron micrograph of a portion of the sample component of FIG. 15A.

FIG. 15C shows a cross-sectional transmission electron micrograph of a portion of the sample component 900 of FIG. 15A. This particular transmission electron micrograph shows a close-up of the elongated tubular grains 906 and the relatively uncompressed grains 904. The elongated grains 906 can be oriented at an angle of between about 30 degrees and about 60 degrees relative to the surface 910. Further, the elongated grains 906 can have a thickness that can be substantially similar to the grains 902. That is, the elongated grains can have a thickness of about 10 nm to about 50 nm. The elongated grains 906 can have a length of between about 1 micron to 3, 4, 5, or even more microns.

Figure 15D:
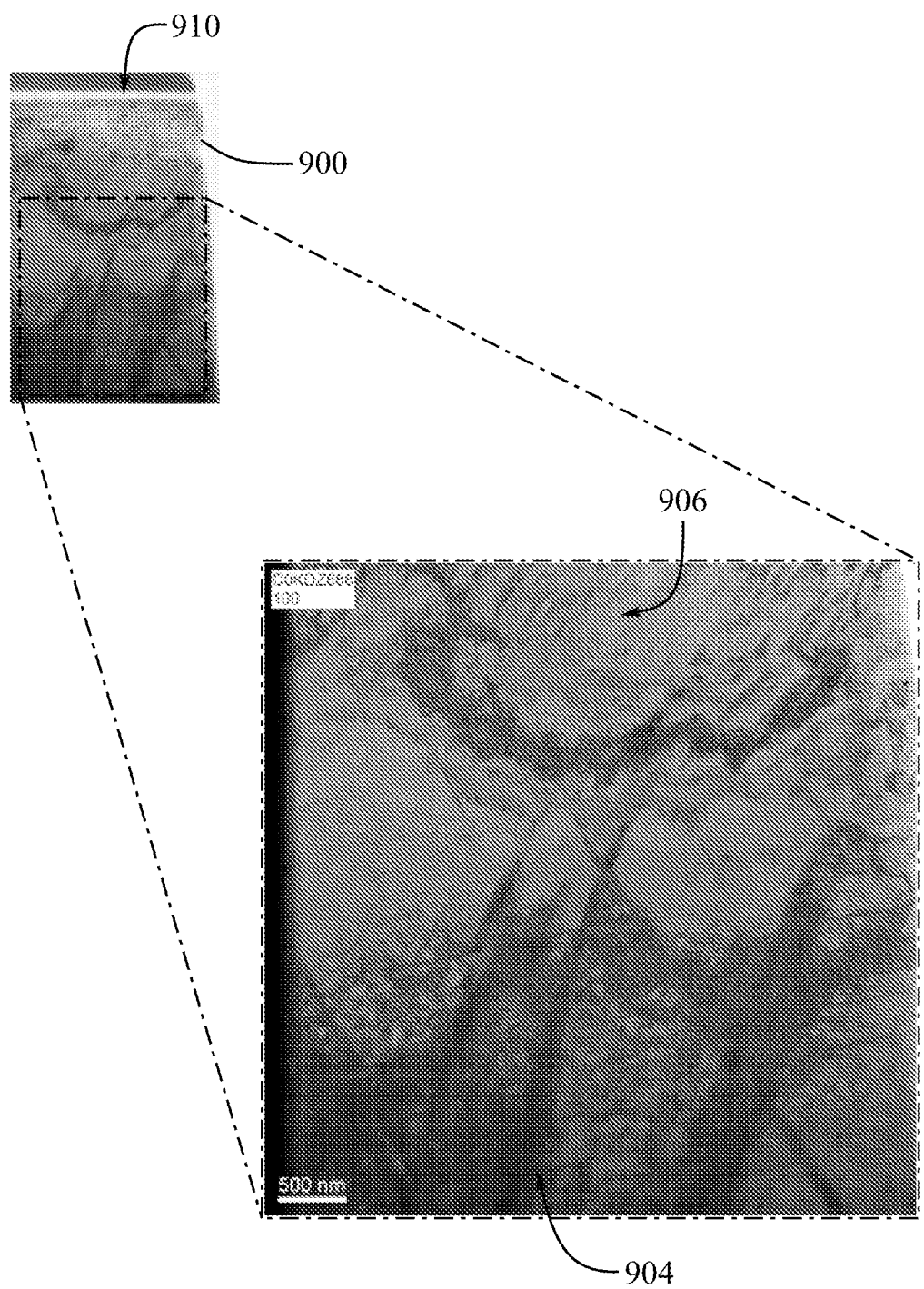
FIG. 15D shows a cross-sectional transmission electron micrograph of a portion of the sample component of FIG. 15A.

FIG. 15D shows a cross-sectional transmission electron micrograph of a portion of the sample component 900 of FIG. 15A. This particular transmission electron micrograph shows a close-up of the relatively uncompressed grains 904, with the elongated grains 906 overlaying the relatively uncompressed grains 904. The grains 904 can be larger in one or more dimensions than the grains 902, 906, and can be substantially equiaxial.

Figure 16A:
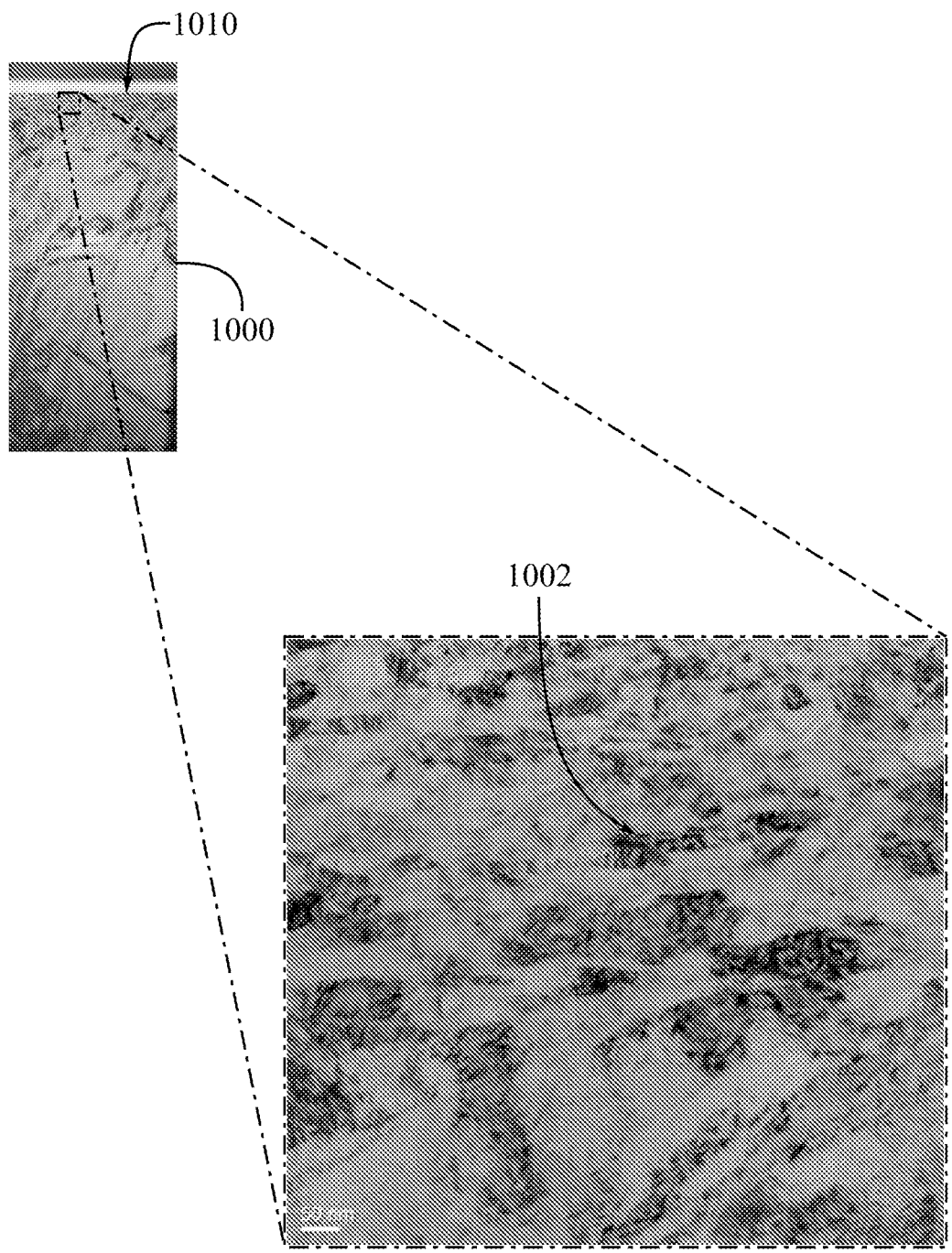
FIG. 16A shows a cross-sectional transmission electron micrograph of a portion of a sample component of an electronic device.

FIG. 16A shows a cross-sectional transmission electron micrograph of a portion of a sample component 1000 including a 316 L alloy of stainless steel that has been subjected to a process for forming a refined microstructure, as described herein. The process was substantially similar to the processes illustrated and described with respect to FIGS. 9-11. In this particular example, the contact portion was translated from left to right across the surface 1010 of the sample 1000. The contact portion exerted a pressure on the surface 1010 of the component 1000 of about 300 bar, and was translated at a rate of about 1.25 meters/minute.

As can be seen, and as described with respect to FIGS. 12 and 15A-15D, the sample component 1000 can include smaller compressed grains 1002 that are adjacent to the surface 1010, and elongated grains and relatively larger uncompressed grains that are disposed below the grains 1002. The compressed grains 1002 adjacent to the surface 1010 can have a horizontal layered structure and can have a thickness or height as illustrated of less than about 50 nm, for example, between about 10 nm and about 50 nm. The grains 1002 can have a substantially planar, platelet, or pancake like shape, with the length and width of the grains 1002 being much larger than the thickness or height of the grains 1002.

Figure 16B:
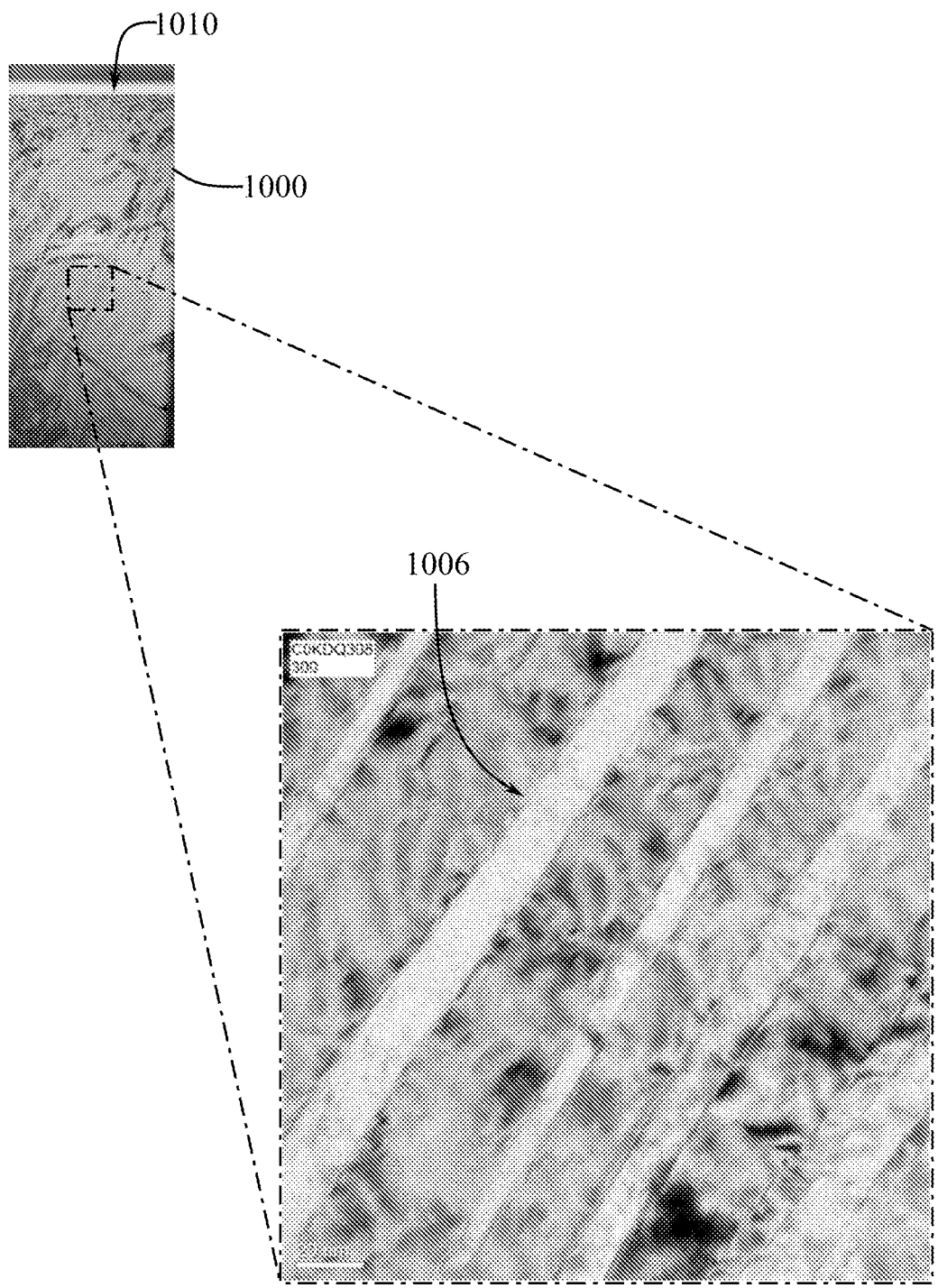
FIG. 16B shows a cross-sectional transmission electron micrograph of a portion of the sample component of FIG. 16A.

FIG. 16B shows a cross-sectional transmission electron micrograph of a portion of the sample component 1000 of FIG. 16A. This particular example shows that because of the higher pressure of about 300 bar exerted by the contact portion of the tool during processing, the microstructure and the grains of the sample 1000 can be affected and deformed to a depth of several microns below the surface 1010. Accordingly, an increase in pressure during the processes described herein can deform grains at increasing depths from the surface. In this particular example, the grains 1006 that are more than 5 microns below the surface 1010 can be elongated grains 1006, for example, as described with respect to FIGS. 15A-15D. Without wishing to be bound by any one theory, it is believed that the increased deformation depth of the grains of the sample 1000 can increase the corrosion resistance and hardness of the sample 1000.

Any number or variety of electronic device components can include a component that has been subjected to a surface treatment, as described herein. The surface treatment or treatments can refine or modify a microstructure of some or all of the component, can densify or reduce the porosity of some or all of the component, and/or can align or reduce gaps between portions of the component. One or more of these surface treatments can include plastically deforming the surface to a desired depth, and/or applying a desire amount of pressure to the surface, as described herein. The component can then be treated, for example, by polishing or forming a surface layer. Various examples of components having been subjected to surface treatments as described herein, surface coatings, and processes for forming the same are described below with reference to FIG. 17.

Figure 17:
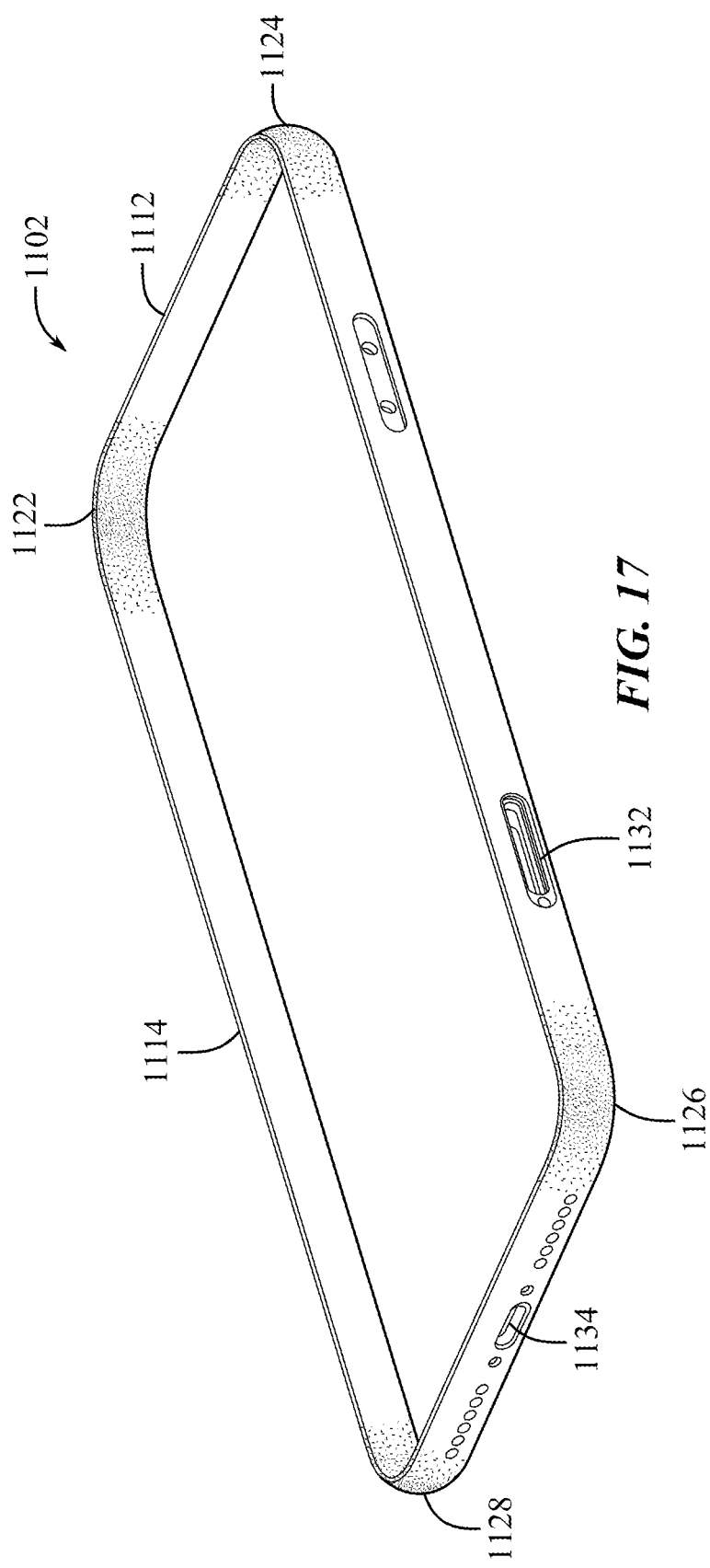
FIG. 17 shows a perspective view of a component of an electronic device.

FIG. 17 shows a perspective view of a component 1102 of an electronic device. In some examples, the component 1102 can be a band of a smartphone, and can include some or all of the features of the band or enclosure 102, 202, 302 described herein. In this example, the band 1102 includes a metallic material, such as a stainless steel alloy, and has been subjected to a surface treatment, for example, as described with respect to FIG. 9-11. The surface treatment has been selectively carried out on corner portions 1122, 1124, 1126, 1128 of the band 1102 that can be prone to experiencing high stress, for example, during drop events. As such, the portions 1122, 1124, 1126, 1128 can include a refined microstructure, as described herein, and can have a first region extending from the exterior surface of the component to a depth of at least about 100 microns having an average grain size less than 45 nanometers.

The untreated portions of the band 1102, meanwhile, can have a substantially unaltered or unaffected grain structure, for example, as illustrated in FIG. 6, and including an average grain size greater than 45 or 50 nanometers. Thus, while the portions 1122, 1124, 1126, 1128 can have an increased hardness relative to the untreated portions of the band 1102, the untreated portions can still be relatively easily machinable. For example, features, such as aperture 1132 through which components can be received, can be machined into the band 1102 after portions 1122, 1124, 1126, 1128 have been formed, but without the need for additional machining time or additional wear on a machining tool. As with the band 302 described above with respect to FIG. 3, the band 1102 can be a substantially unitary body, or can include multiple components, such as portions 1112, 1114, that are joined together. Similarly, a feature such as aperture 1134 can be formed in another untreated area of the band 1102. Although four separate portions 1122, 1124, 1126, 1128 including a refined microstructure as described herein are shown in FIG. 17, in some examples, a component can include any number of portions, and each portion can be any desired size or area. Further, in some examples, an entire surface of the component 1102 that defines an exterior portion of the electronic device can include a refined grain structure, as defined herein.

Any number or variety of electronic device components can include a component that has been subjected to a surface treatment, as described herein. The surface treatment or treatments can refine or modify a microstructure of some or all of the component, can densify or reduce the porosity of some or all of the component, and/or can align or reduce gaps between portions of the component. One or more of these surface treatments can include plastically deforming the surface to a desired depth, and/or applying a desire amount of pressure to the surface, as described herein. The component can then be treated, for example, by polishing or forming a surface layer. Various examples of components having been subjected to surface treatments as described herein, surface coatings, and processes for forming the same are described below with reference to FIGS. 18A-20.

Figure 18A:
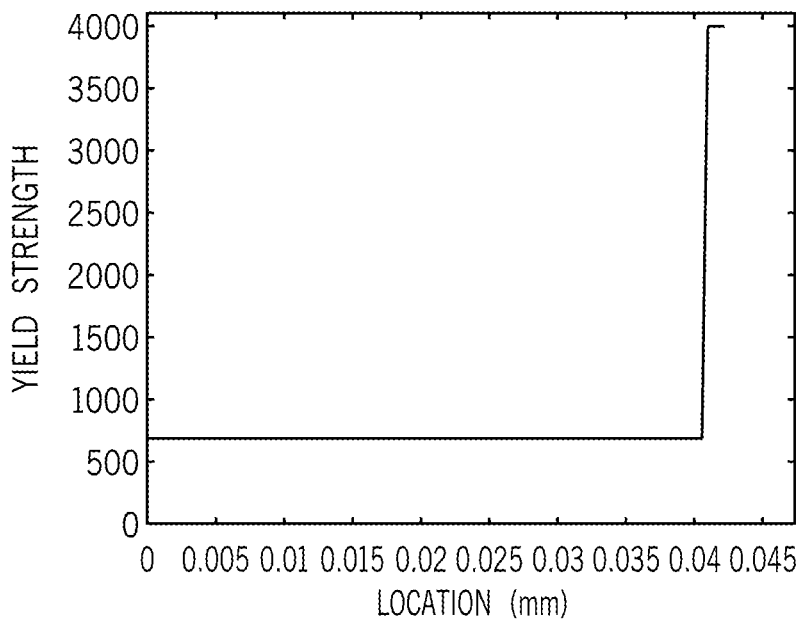
FIG. 18A shows a plot of yield strength as a function of radial depth for a component of an electronic device experiencing a simulated impact.

FIG. 18A shows a plot of yield strength as a function of radial depth for a component of an electronic device including a metallic material, such as stainless steel, having a diameter of 40 microns and having a 2 micron thick ceramic PVD layer formed on the component. The plot is the result of a finite element analysis model of a simulated localized high-stress event, such as an impact. Further, the metallic material of the component has not been subjected to any surface treatment and does not include a refined microstructure. Accordingly, there is a large mismatch in the hardness of the PVD layer and the material of the component, as described herein.

The interface between the component and the PVD layer is at location 0.04 mm on the right side of the plot. The interfacial stress between the component and the PVD layer during the simulated impact was calculated to be approximately 3.5 GPa. As can be seen from the sharp increase in yield strength to 4 GPa, the intrinsic yield strength of the PVD layer, at location 0.04 mm, the PVD layer has not effectively transferred any load to the metallic component and has experienced a brittle failure, likely due to the mismatch in hardness between the metallic component and the PVD layer.

Figure 18B:
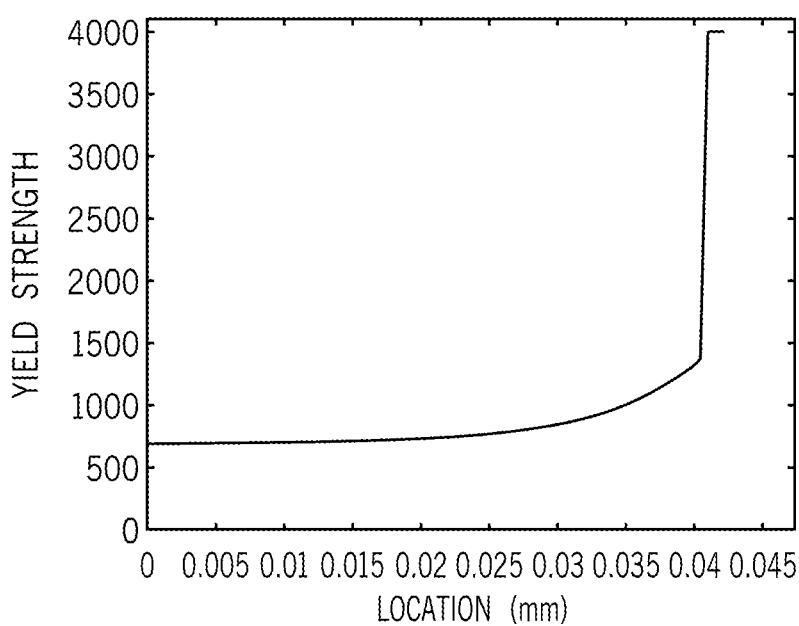
FIG. 18B shows a plot of yield strength as a function of radial depth for a component of an electronic device experiencing a simulated impact.

FIG. 18B also shows a plot of yield strength as a function of radial depth for a component of an electronic device including a metallic material, such as stainless steel, having a diameter of 40 microns and having a 2 micron thick ceramic PVD layer formed on the component. In the example of FIG. 18B, however, the component includes a refined microstructure, as described herein, and thus, includes a region having an increased hardness relative to the untreated metallic material. Thus, the hardness mismatch between the PVD layer and the metallic material at the interface is reduced.

This is shown in the plot as an upward curve of the yield strength near to the interface between the metallic material and the PVD layer, indicating that load was transferred from the PVD layer to the metallic material without complete failure of the PVD layer. As a result, the calculated interfacial stress was found to be approximately 2.4 GPa, a reduction of over 1 GPa relative to an untreated component. Accordingly, in some examples, an interfacial stress between a region of the component having a refined microstructure as described herein and a layer formed on the component, such as a ceramic PVD layer, during an impact on the layer can be less than an interfacial stress between the layer and a metallic component that does not have a refined grain structure and that has an average grain size greater than, for example, 45 microns.

Figure 19:
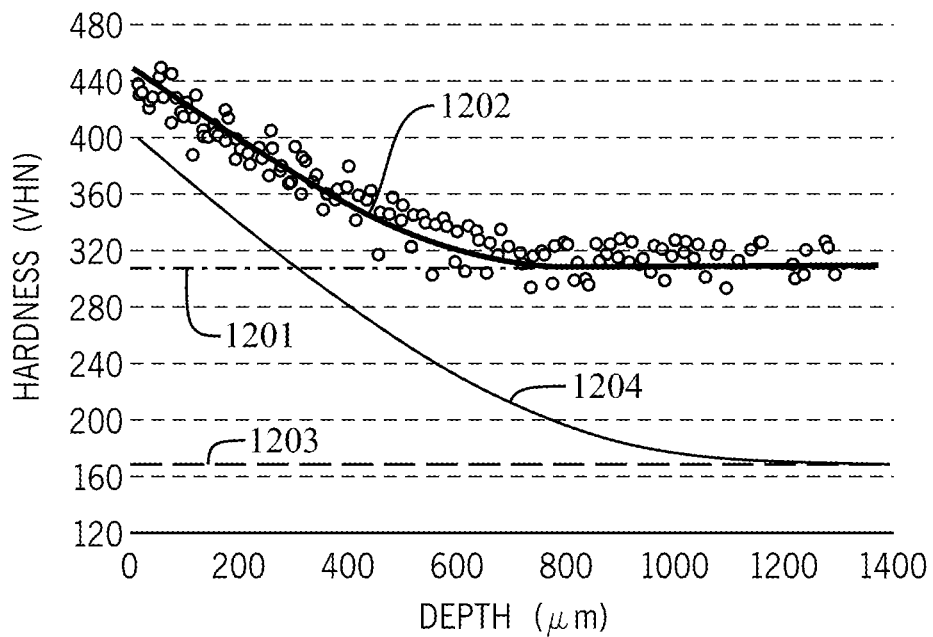
FIG. 19 shows a plot of hardness as a function of depth for components of an electronic device.

FIG. 19 shows a plot of hardness (represented as a Vicker's hardness number, or VHN) as a function of depth for sample components of an electronic device having been subjected to a treatment, as described herein. The components can include some or all of the features of the components 102, 202, 300, 402, 502, 700, 902 as described herein. In this example, a first sample was work-hardened to a half-hard state prior to being subjected to the refining treatment, while a second sample was subjected to an annealing process. Accordingly, the untreated material of the first sample has a hardness 1201 of about 310 VHN (3.1 GPa) through the entire depth of the sample, while the untreated material of the second sample has a hardness 1203 of about 170 VHN (1.7 GPa) through the entire depth of the sample.

As can be seen in FIG. 19, the refining treatment has affected the grain sizes, and thus hardness 1202 of the material of the first sample extending to a depth of about 700 microns from the surface of the component. In this example, the material at the surface of the first sample has a hardness 1202 of about 450 VHN (4.4 GPa), an increase of about 140 VHN (1.4 GPa) over the untreated material. Further, the hardness 1202 of the material decreases along an approximately linear gradient towards the interior of the first sample component, until a depth of approximately 700 microns. Thereafter, the material has been substantially unaffected by the surface treatment process.

For comparison, FIG. 19 shows a plot of hardness 1204 as a function of depth for the second sample component of an electronic device having been subjected to an annealing process and a surface treatment as described herein. The component and material of the second sample can be substantially identical to the component of the first sample, with the only difference being the treatment processes involved. As can be seen, the resultant surface hardness 1204 of the treated second sample is comparable to the treated first sample at about 400 VHN (3.9 GPa). The annealed second example component includes a much larger drop-off in hardness, with the bulk material only having a hardness 1204 of around 160 KHN (1.6 GPa). Further, the annealed component was exposed to high levels of heat during the annealing process, meaning that any parts unable to withstand this heat could not have been integrated with the component prior to treatment. In contrast, the treatment of the first example component does not require heat or thermal energy, and can be carried out on a component that has been integrated with any number of other components, even components formed of relatively low-melting point materials, such as polymers.

Figure 20:
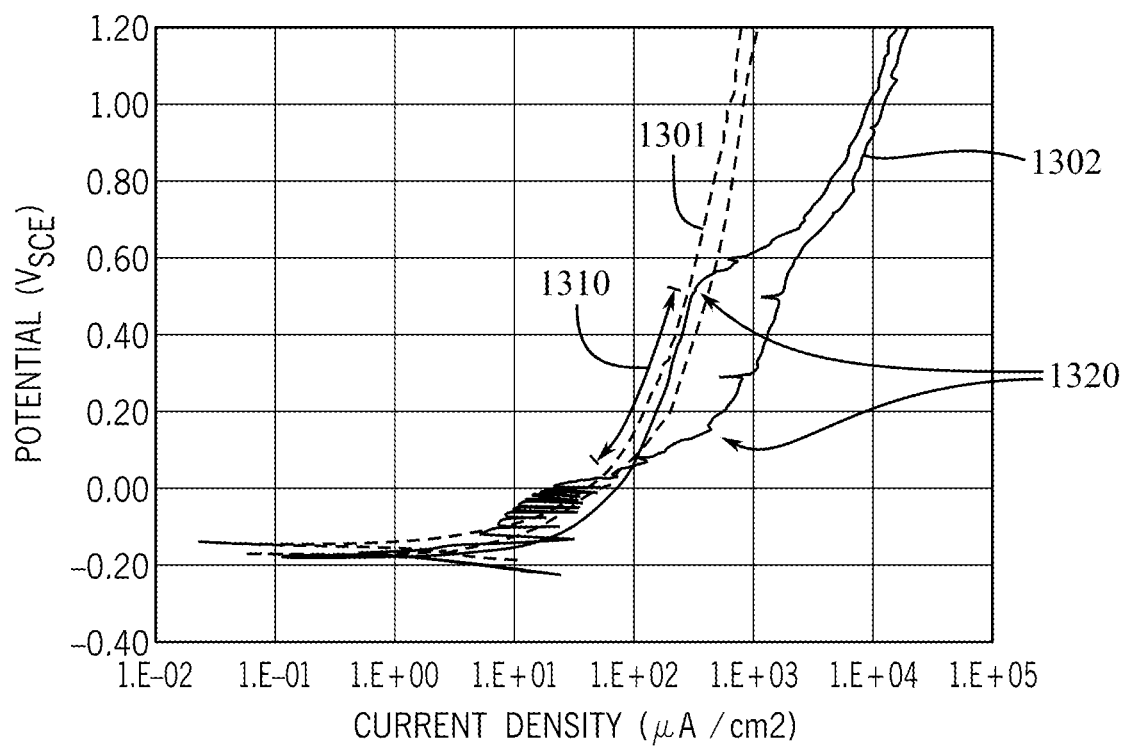
FIG. 20 shows a plot of potential as a function of current density for samples undergoing a corrosion resistance test.

FIG. 20 shows a plot of potential ($V_{SCE}$) as a function of current density ($\mu A/cm2$) for a first sample 1301 and a second sample 1302 undergoing a corrosion resistance test in a saline solution. Each sample included stainless steel, however the first sample 1301 was subjected to a surface treatment, as described herein, while the second sample 1302 was not. As can be seen, the untreated sample has a critical crevice potential 1320 of about 0.5 to about 0.8 V. The critical crevice potential is the potential, or voltage, required to initiate corrosion in a crevice of the sample exposed to an electrolyte, such as saline. In general, the higher the critical crevice potential of a sample, the more resistant to everyday environmental corrosion the sample will be.

Further, once this corrosion has begun, a lower potential 1320 can drive the corrosion. In contrast, the treated sample 1301 is substantially more resistant to pitting and the test was unable to reach a critical crevice potential. Instead, only passive corrosion 1310 occurred, independent of the potential. Thus, a metallic sample or component subjected to a surface treatment process as described herein can be substantially more corrosion resistant than an untreated sample or component.

Figure 21:
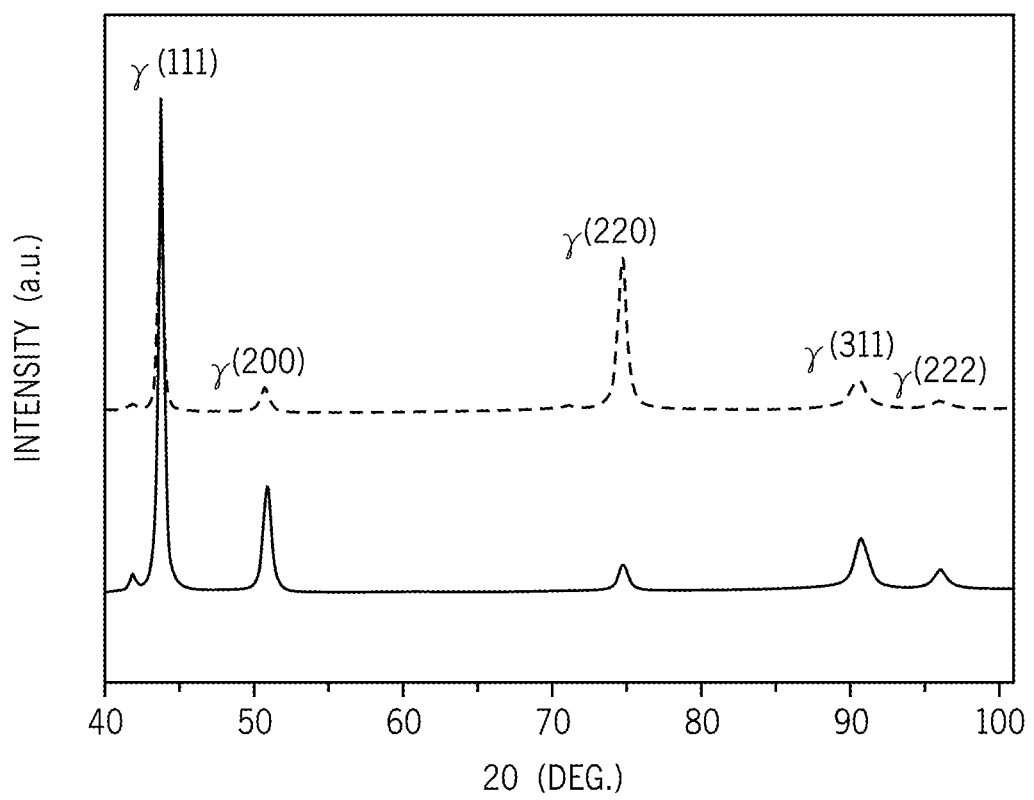
FIG. 21 is an X-ray diffractogram for a component of an electronic device before and after a treatment process as described herein.

FIG. 21 is an X-ray diffractogram for a component of an electronic device both before and after a surface treatment process, as described herein. In this example, the component includes a 316 L alloy of stainless steel, and the untreated component has less than about 1 volume percent martensite. As can been seen in the plot, none of the peaks associated with martensitic steel are present in the untreated steel, indicated here with a solid line. After being subjected to treatment, the (220) peak has increased, however there are still no peaks associated with martensitic steel. Accordingly, the surface treatments described herein can be carried out with the undesirable formation of martensitic phases, which can undesirable impact the magnetic properties of the component, for example, by decreasing the magnetic permeability thereof. Various examples of processes for forming the same are described below with reference to FIGS. 22-23.

Figure 22:
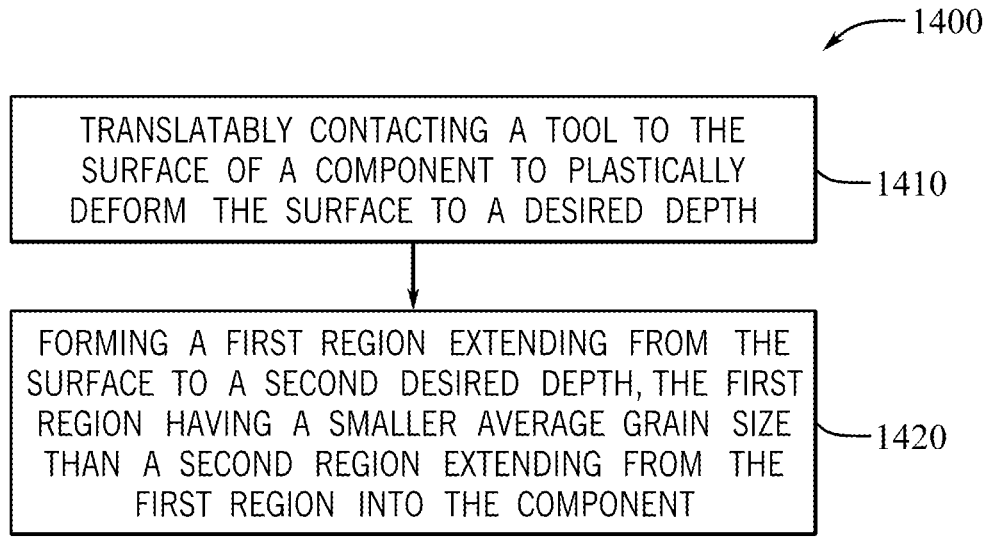
FIG. 22 is a process flow diagram of a method for treating a component of an electronic device.

FIG. 22 illustrates a process flow diagram of an exemplary process for refining the grains of a component including a metallic material, as described herein. The process 1400 for refining the grains of a region of the component can include translatably contacting a tool to the surface of the component to plastically deform the surface to a desired depth at block 1410, and forming a first region extending from the surface to a second desired depth, the first region having a smaller average grain size than a second region extending from the first region into the component at block 1420.

At block 1410, a tool is translatably contacted to the surface of the component at a desired location, for example, as described above with reference to FIGS. 9-11. The tool can plastically deform the surface to a depth of at least 12 microns, at least 15 microns, at least 20 microns, at least 25 microns, at least 30 microns, at least 40 microns, or at least 50 microns or more. Further, in some examples, the depth to which the tool plastically deformed the surface can be varied at various desired locations. The tool can be translated, for example, by sliding, grinding, or rolling at a desired rate. The tool can include a contact portion that is substantially similar to and can include any of the features of the contact portion 710 described with respect to FIGS. 9-11. A contact area of the tool on the surface can be less than 500 square microns. In some examples, the contact area can be less than 400 square microns, less than 300 square microns, less than 250 square microns, less than 200 square microns, less than 150 square microns, or less than 100 square microns.

At block 1420, a first region extending from the contacted surface to a second desired depth is formed. Although depicted as a separate process step, in some examples, the formation can occur concurrently or simultaneously with the contacting of the tool to the surface, as mentioned in block 1410. The first region can extend to a depth of at least 100 microns, for example, to a depth of 300 microns. In some examples, the first region can extend to a depth of at least 150 microns, at least 200 microns, at least 250 microns, at least 300 microns, at least 400 microns, at least 500 microns, at least 600 microns, at least 700 microns, at least 800 microns, at least 900 microns, or even up to 1 mm into the component from the surface.

In some examples, the first region can have an average grain size less than a desired size, such as less than 45 nanometers as described herein. A second region having an average grain size greater than a desired size, for example greater than 45 nanometers, can extend from the first region further into the component, as described herein. Additionally, the process 1400 can optionally be repeated a number of times over the same area or surface of a component to further refine the grains thereof. For example, blocks 1410 and 1420 can be repeated once, twice, or even up to 15 times or more in order to form a first region extending a desired depth into the component and having an average grain size less than a desired size, such as less than 45 nanometers.

Figure 23:
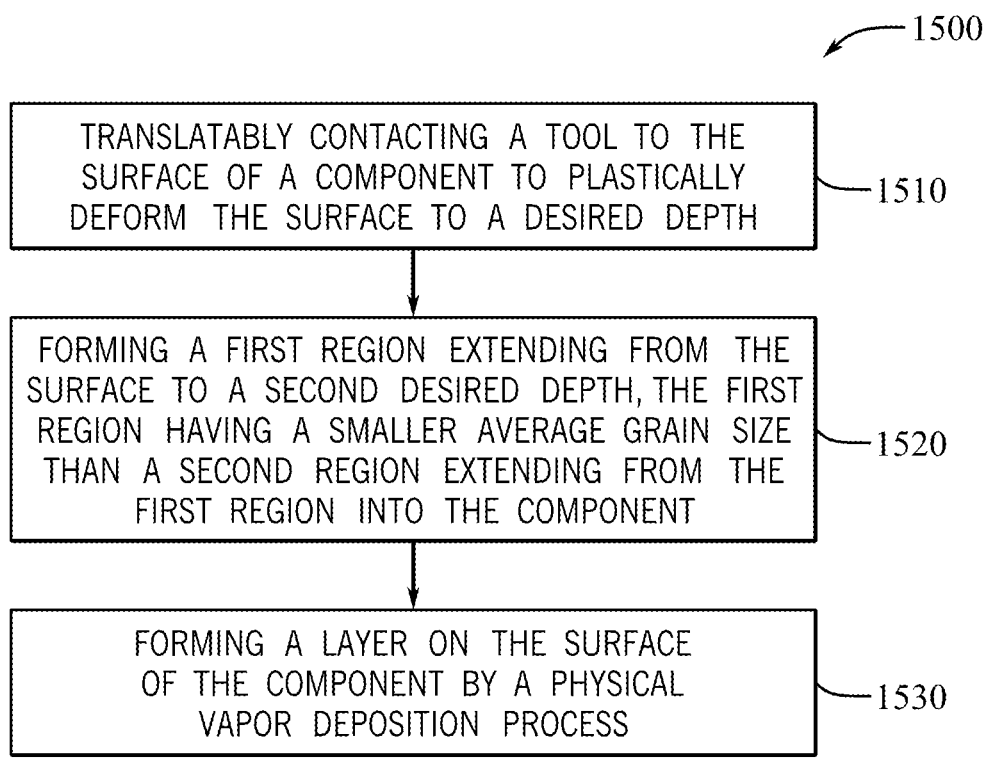
FIG. 23 is a process flow diagram of a method for treating a component of an electronic device.

FIG. 23 illustrates a process flow diagram of an exemplary process for treating a component including a metallic material, as described herein. The process 1500 can include translatably contacting a tool to the surface of the component to plastically deform the surface to a desired depth at block 1510 and forming a first region extending from the surface to a second desired depth, the first region having a smaller average grain size than a second region extending from the first region into the component at block 1520, and forming a layer on the surface of the component by a deposition process at block 1530.

In some examples, blocks 1510 and 1520 can be substantially identical to, and can include some or all of the features of blocks 1410 and 1420, described with respect to FIG. 22. At block 1530, a layer is formed over the surface by a deposition process. In some examples, the layer can be formed by a vapor deposition process, such as a physical vapor deposition process or a chemical vapor deposition process. In some examples, the layer can have any desired thickness and can be up to 10 microns, 20 microns, 50 microns, 100 microns, 250 microns, 500 microns, or more in thickness. In some examples, the layer can include a ceramic material, such as a carbide, a nitride, or a carbonitride. In some examples, the layer can include titanium carbonitride, chromium carbonitride, or combinations thereof.

Any number or variety of electronic device components can include a component that has been subjected to a surface treatment, as described herein. The surface treatment or treatments can refine or modify a microstructure of some or all of the component, can densify or reduce the porosity of some or all of the component, and/or can align or reduce gaps between portions of the component. One or more of these surface treatments can include plastically deforming the surface to a desired depth, and/or applying a desire amount of pressure to the surface, as described herein. The component can then be treated, for example, by polishing or forming a surface layer. Various examples of components having been subjected to surface treatments as described herein, surface coatings, and processes for forming the same are described below with reference to FIGS. 24A and 24B.

Figure 24A:
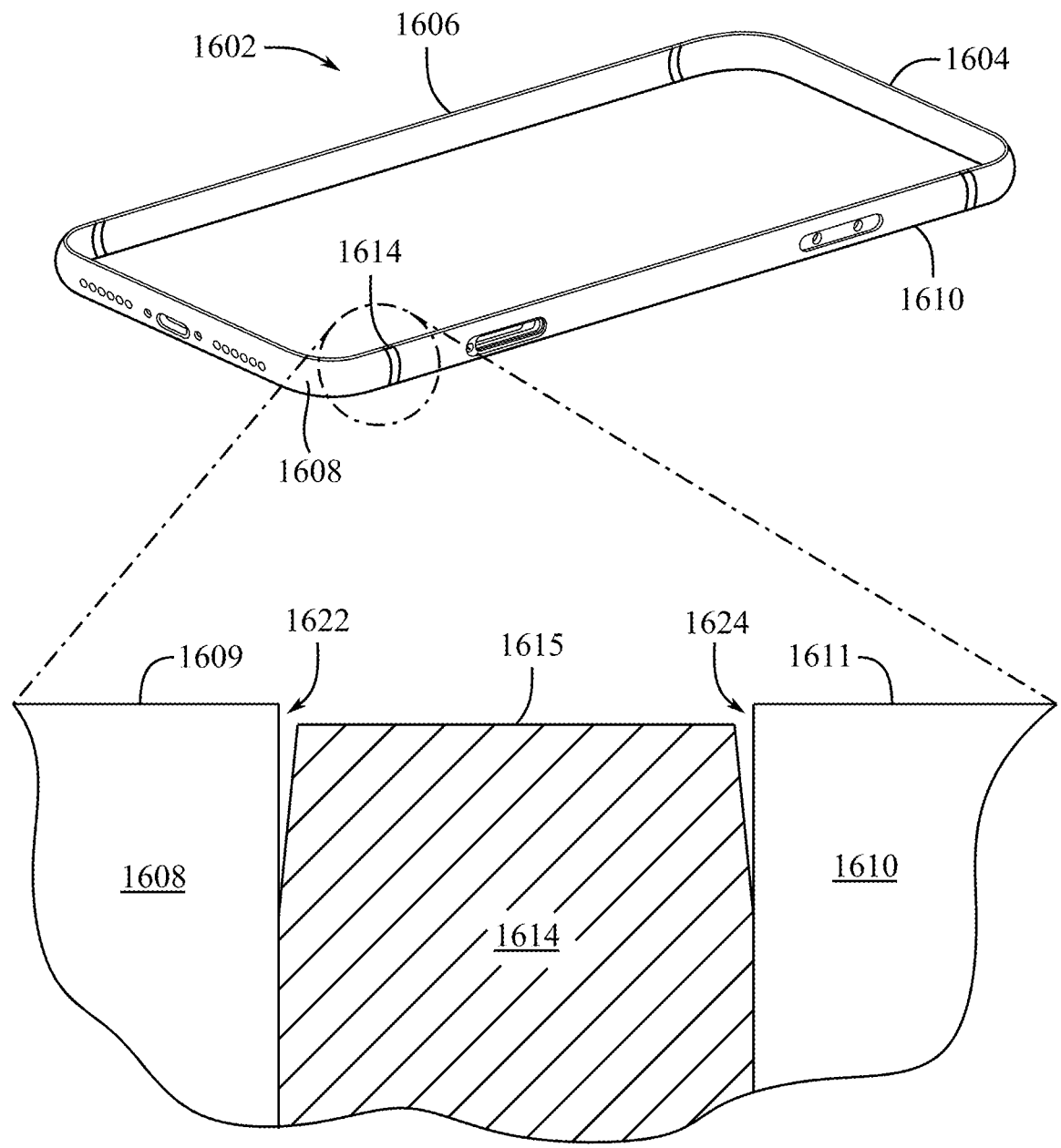
FIG. 24A shows a perspective view of a component of an electronic device and a cross-sectional view of a portion of the component.

FIG. 24A shows a perspective view of a component 1602 of an electronic device. In some examples, the component 1602 can be a band of a smartphone, and can include some or all of the features of the band or enclosure 102, 202, 302 described herein. In this example, the band 1602 includes sidewall components 1604, 1606, 1608, 1610. These sidewall components 1604, 1606, 1608, 1610 can be joined together by a material 1614. The material 1614 can be any material as desired, for example, a non-conductive material such as a non-conductive polymer. In this example, and as shown, the components 1604, 1606, 1608, 1610 can be integrated with, or joined by, the material 1614 prior to being subjected to a surface treatment. In some examples, the material 1614 can be injection molded into one or more retention features defined by the components 1604, 1606, 1608, 1610 to join the components 1604, 1606, 1608, 1610 together.

As can be seen in the inset of FIG. 24A, in some examples this molding process can leave a gap, opening, and/or crevice 1622 between the component 1608 and the material 1614. A gap 1624 can also exist, or be defined by the component 1610 and the material 1614. Further, the portion 1615 of the exterior surface defined by the material 1614 may, in some examples, be misaligned with the portions 1609, 1611 of the exterior surface defined by the metallic surfaces of the components 1608, 1610. That is, the portions 1609, 1611, 1615 of the exterior surface defined by the material 1614 and components 1608, 1610 may not be aligned in a single plane. While the misalignment between the surface 1615 and the surfaces 1609, 1611, and the gaps 1622, 1624 may be relatively small and even substantially imperceptible to a human, for example, on the order 10 s or 100 s of microns, the surface offset and gaps can provide ingress points for corrosive or other undesirable materials that can affect the aesthetics and/or function of the component 1602 over time. Accordingly, in some examples, a surface treatment as described herein can serve to align the surfaces 1615, 1609, 1611 and to close or reduce the size of the gaps 1622, 1624.

Figure 24B:
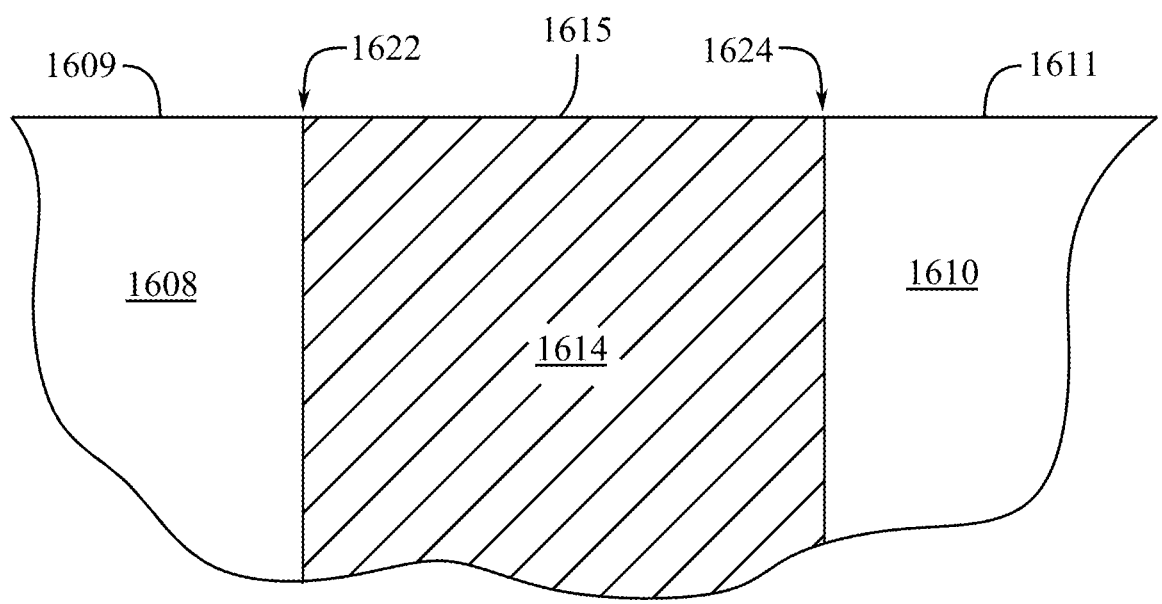
FIG. 24B shows a cross-sectional view of the portion of the component after being subjected to a process.

FIG. 24B shows the example component 1602 after having been subjected to a surface treatment as described herein. In some examples, a surface treatment can include contacting the surface 1609 of the metallic portion 1608 with a tool at a desired pressure to deform the portion 1608 to a desired depth, as described with respect to FIGS. 9-11. The tool can be translated across the surface 1609, and subsequently across the surface 1615 and 1611, as described herein. That is, the tool can translate from left to right across the surfaces 1609, 1615, 1611 as illustrated in FIG. 24B. The tool can contact and exert the desired pressure on both the surfaces 1615 and 1611. While the metallic portions 1609, 1611 can be plastically deformed by the surface treatment, in some examples, the surface 1615 and/or non-conductive or polymeric portion 1614 may only be elastically deformed, even though it is subjected to a desired pressure and/or deformed to a same or similar depth as the portions 1608 and 1610.

Accordingly, the plastic deformation of the portions 1608, 1610 can serve to align the surfaces 1609, 1615, and 1611 with one another. That is, the surfaces 1609, 1615, and 1611 can be aligned in a single plane and can together define a substantially flat, planar, and/or continuous surface. Further, as shown in FIG. 24B, the surface treatment can reduce a size and/or completely close any gaps 1622, 1624 between the portions 1608, 1610 and the material 1614. In this way, a surface treatment as described herein can increase a corrosion resistance of a component 1602 by reducing ingress points for contaminants. A surface treatment, as described herein, can also provide a pleasing and desirable aesthetic appearance and feel to the component 1602 by aligning the surfaces thereof. Further, by sealing, closing, or reducing a dimension of the gaps 1622, 1624, a surface treatment can increase a level of water resistance of the component 1602.

Any number or variety of electronic device components can include a component that has been subjected to a surface treatment, as described herein. The surface treatment or treatments can refine or modify a microstructure of some or all of the component, can densify or reduce the porosity of some or all of the component, and/or can align or reduce gaps between portions of the component. One or more of these surface treatments can include plastically deforming the surface to a desired depth, and/or applying a desire amount of pressure to the surface, as described herein. The component can then be treated, for example, by polishing or forming a surface layer. Various examples of components having been subjected to surface treatments as described herein, surface coatings, and processes for forming the same are described below with reference to FIGS. 25A-25D.

Figure 25A:
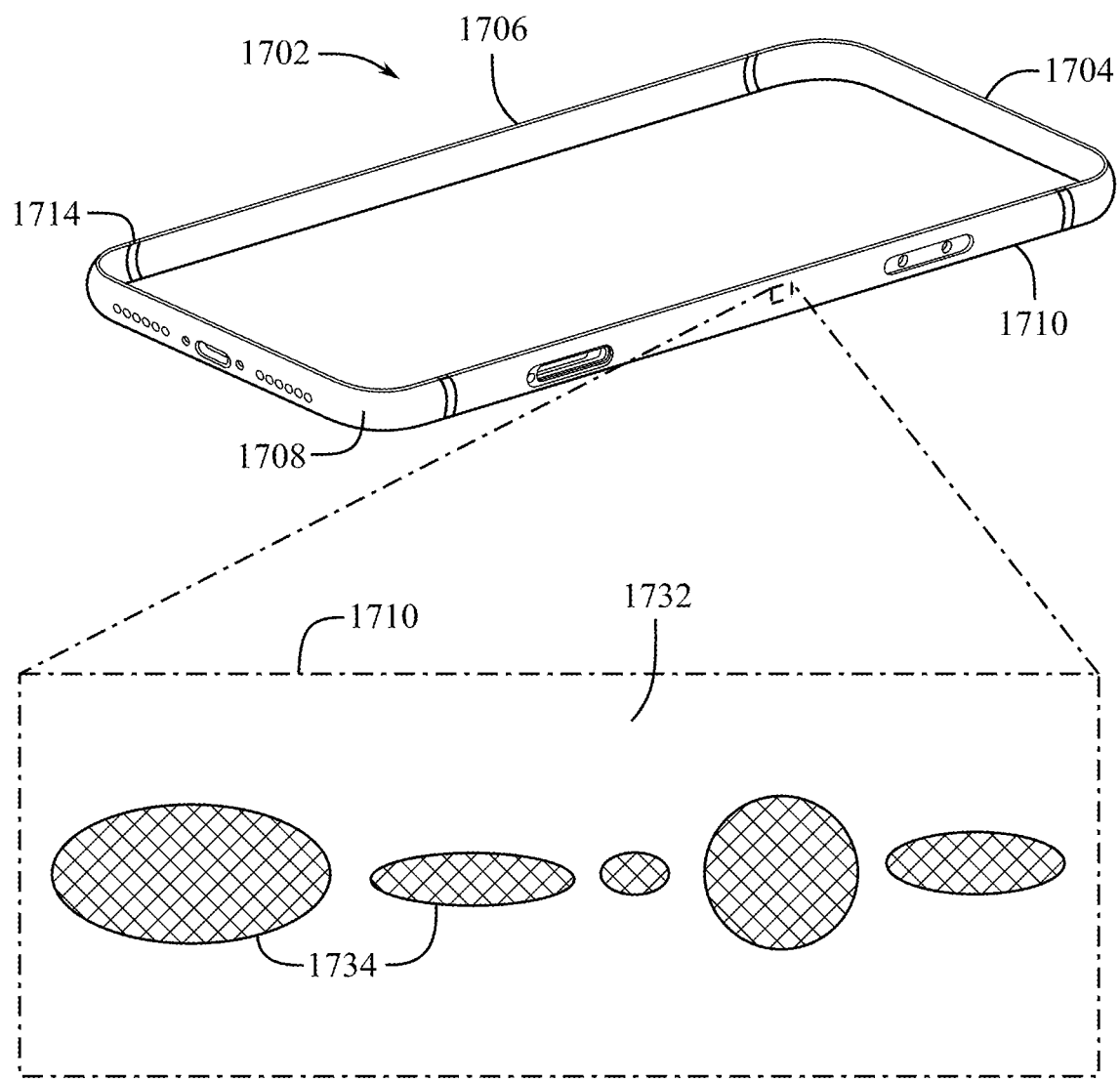
FIG. 25A shows a perspective view of a component of an electronic device and a cross-sectional view of a portion of the component.

FIG. 25A shows a perspective view of a component 1702 of an electronic device. In some examples, the component 1702 can be a band of a smartphone, and can include some or all of the features of the band or enclosure 102, 202, 302 described herein. In this example, the band 1702 includes sidewall components 1704, 1706, 1708, 1710. These sidewall components 1704, 1706, 1708, 1710 can be joined together by a material 1714. The material 1714 can be any desired material, for example, a non-conductive material such as a non-conductive polymer. In this particular example, the sidewall components 1704, 1706, 1708, 1710 can include steel, such as a stainless steel alloy like 316 L stainless steel.

In some examples, the sidewall components 1704, 1706, 1708, 1710 can be formed, at least partially, by casting or any other process whereby molten metal is cooled or solidified to form the components 1704, 1706, 1708, 1710. As can be seen in the inset section of FIG. 25A, this solidification process can result in formation of clusters 1734 of grains of an intermetallic sigma phase of material. These sigma phase grain clusters 1734 can be surrounding by a desirable phase or phases 1732 of the material including component 1710, for example, a non-martensitic and/or austenitic phase of steel.

In some examples, as described herein, it can be desirable to polish a surface of the component 1710. The sigma phase grain clusters 1734, however, can be present in the cosmetic plane of the component 1710, that is the plane that is polished and/or exposed during a polishing process. The sigma phase grain clusters 1734 can be revealed during such processes and can provide an undesirable cosmetic appearance, showing up as spots or splotches. Further, the relatively high hardness of the sigma phase grain clusters 1734 can cause undesirable complications during the polishing process. Accordingly, it can be desirable to reduce or eliminate the presence of the sigma phase grain clusters 1734 through a surface treatment as described herein prior to polishing the component 1710 or prior to subjecting the component to any other processing.

Figure 25B:
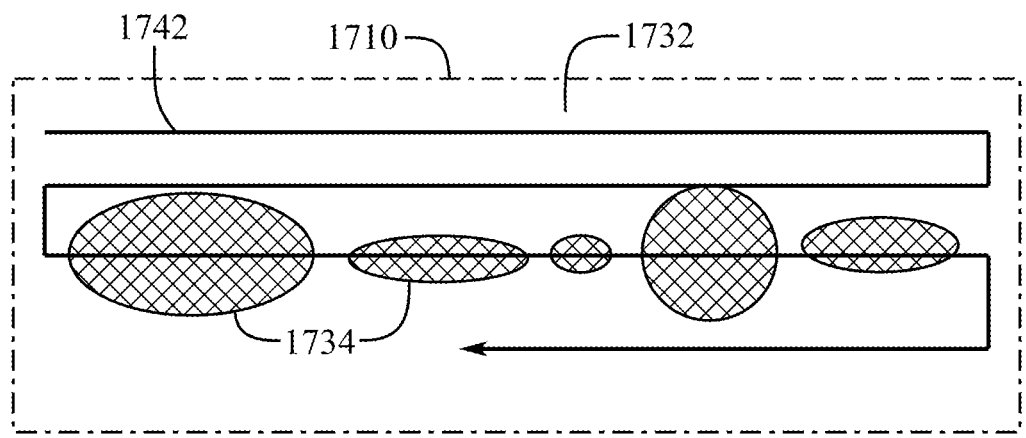
FIG. 25B shows a cross-sectional view of the portion of the component of FIG. 25A and a schematic representation of a process.

FIG. 25B shows the translational path 1742 of a tool that is contacting a region of the surface of the component 1710 that includes or overlays sigma phase grain clusters 1734. The tool can contact the surface and exert a desired pressure thereon and/or deform the surface to a desired depth, as described herein. Further, the tool can be translated or rastered across the surface to ensure that the path 1742 of the tool translates over the sigma phase grain clusters 1734, or a region of the surface overlaying the sigma phase grain clusters 1734.

Figure 25C:
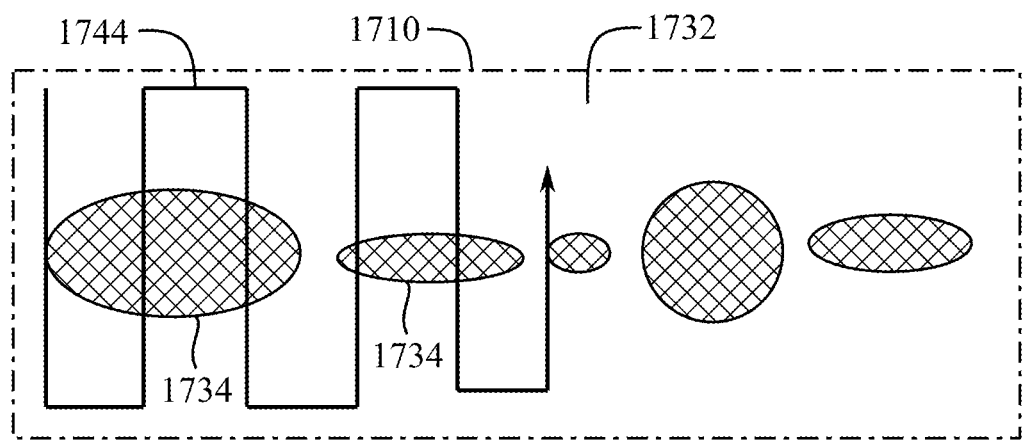
FIG. 25C shows a cross-sectional view of the portion of the component of FIG. 25A and a schematic representation of a process.

FIG. 25C shows an alternate translational path 1744 of the tool during a surface treatment as described herein, whereby the path can cross over a single cluster 1734 multiple times during a single process. Although two particular translational paths 1742, 1744 are illustrated in FIGS. 25B and 25C, it should be understood that the surface treatments described herein can use or include substantially any desired translational path.

Figure 25D:
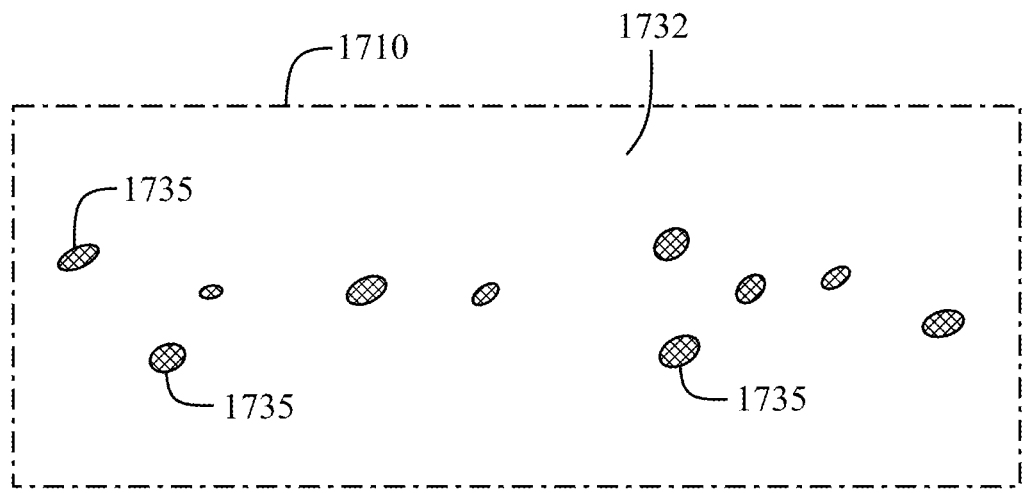
FIG. 25D shows a cross-sectional view of the portion of the component after being subjected to a process.

FIG. 25D shows the component 1710 after having been subjected to a surface treatment, as described herein. As can be seen, the surface treatment can modify the clusters 1734 of sigma phase grains to break apart the clusters 1734 into smaller and/or more spaced apart portions of sigma phase material 1735. That is, the sigma phase grain clusters 1734 can now have grains of the phase 1732 disposed between at least some of the sigma phase grains of the cluster 1734, resulting in smaller portions or clusters 1735 of sigma phase grains or material. Further, in some examples, the sigma phase grain clusters 1734 can include sigma phase grains having a first average grain size. This first average grain size can be about 10 microns to about 100 microns, as measured across a major dimension of the sigma phase grains of the cluster 1734. After being subjected to a surface treatment as described herein, the sigma phase grains can have a reduced second average grain size. In some examples, this reduced second average grain size can be between about 1 micron and about 10 microns, or even smaller. Accordingly, in some examples, the sigma phase grains of the smaller clusters 1735 can also have a reduced average grain size relative to the sigma phase grains of the clusters 1734. In this way, any subsequent polishing and/or cosmetic processes performed on the surface treated component 1710 can proceed with reduced complications or with reduced undesirable aesthetic properties associated with the clusters 1734.

Any number or variety of electronic device components can include a component that has been subjected to a surface treatment, as described herein. The surface treatment or treatments can refine or modify a microstructure of some or all of the component, can densify or reduce the porosity of some or all of the component, and/or can align or reduce gaps between portions of the component. One or more of these surface treatments can include plastically deforming the surface to a desired depth, and/or applying a desired amount of pressure to the surface, as described herein. The component can then be treated, for example, by polishing or forming a surface layer. Various examples of components having been subjected to surface treatments as described herein, surface coatings, and processes for forming the same are described below with reference to FIGS. 26A-28.

Figure 26A:
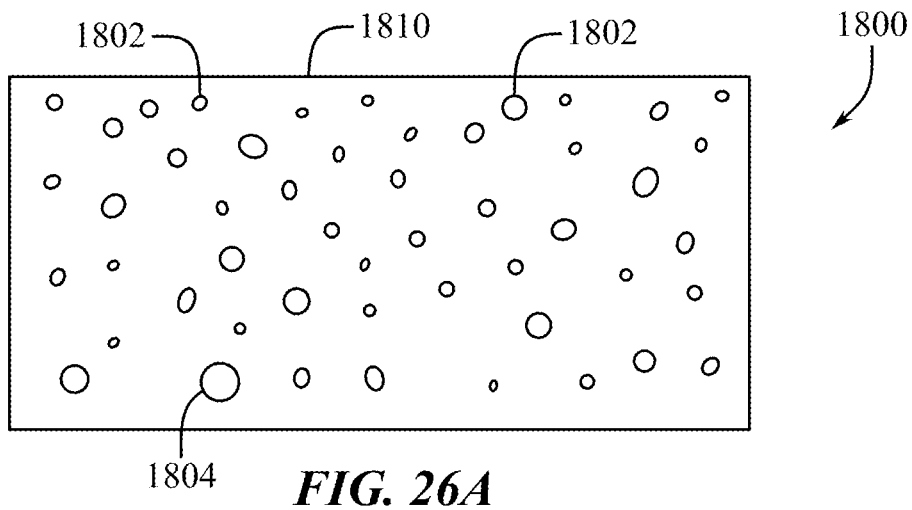
FIG. 26A shows a cross-sectional view of a portion of a component of an electronic device.

FIG. 26A illustrates a cross-sectional view of a portion of a component 1800 of an electronic device that has not been subjected to a surface treatment as described herein. In some examples, the component 1800 can be a housing of an electronic device and can include some or all of the features of the housings 100, 200, 400 described herein. In some examples, the component 1800 can define an exterior surface 1810, that can also at least partially define the exterior surface of an electronic device including the component 1800. The component 1800 can include or be formed from a metallic material, for example, aluminum, steel, titanium, other metals, or alloys thereof. In some examples, the component 1800 can be formed by a powder metallurgy process, such as an additive manufacturing process, a powder forging process, a hot isostatic pressing (HIP) process, a metal injection molding (MIM) process, a selective sintering process, or any other power metallurgy process or combinations thereof.

As a result of this formation process, the metallic body of the component 1800 can include or define one or more pores or voids 1802, 1804. In some examples, these pores 1802, 1804 can be substantially evenly distributed throughout the component 1800. In some examples, as described herein, it can be desirable to polish or perform other treatment processes on the component 1800. Such processes can result in the removal of material from the surface 1810 to form a new or polished cosmetic surface. Owing to the location of the pores 1802 near the surface 1810, however, these processes can remove the material overlaying the pores 1802, thereby revealing the pores 1802 at the cosmetic surface. The revealed pores 1802 can show up as divots or undesirable cosmetic defects on the cosmetic surface after a polishing or another treatment process. Accordingly, it can be desirable to subject the component 1800 to a surface treatment as described herein to reduce the porosity of the component in a region adjacent to the surface 1810 in order to provide a relatively defect or divot free cosmetic surface after polishing or other treatments have been carried out.

Figure 26B:
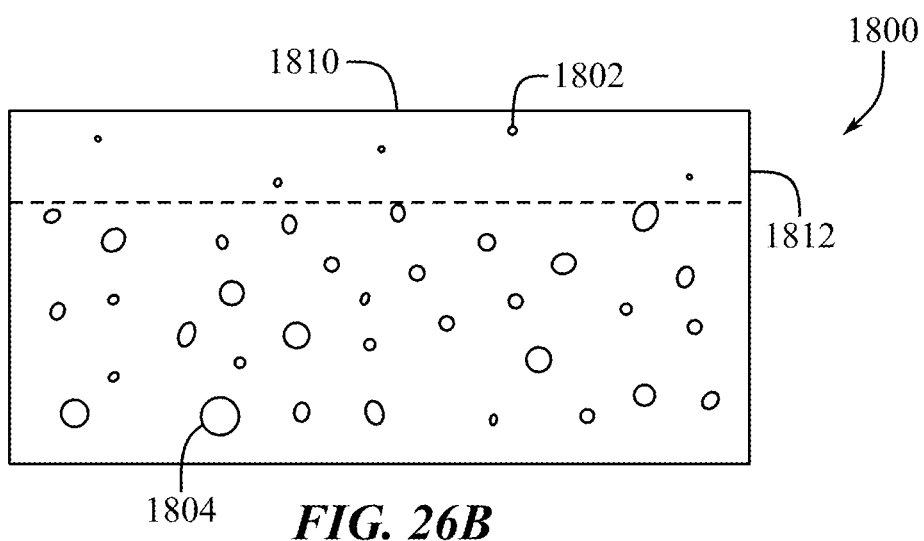
FIG. 26B shows a cross-sectional view of the portion of FIG. 26A after being subjected to a process.

FIG. 26B illustrates the portion of the component 1800 shown in FIG. 26A after having been subjected to a surface treatment, as described herein. For example, after having a tool contact the surface 1810 to exert a desired amount of pressure and/or deform the component 1810 to a desired depth, as described herein. As can be seen, after having been subjected to such a surface treatment, the metallic body of the component 1800 can include a first region 1812 extending from the surface 1810 to a depth below the surface that has a reduced porosity relative to a second region adjacent to and/or below the first region 1812. In some examples, the first region can extend a depth of at least 50 microns, at least 100 microns, at least 150 microns, at least 200 microns, at least about 400 microns, at least about 600 microns, at least about 800 microns, or even at least about 1 mm.

In some examples, the first region 1812 can define fewer pores 1802 per volume relative to the number of pores 1804 per volume in the second region adjacent to the first region 1812. That is, in some examples, the average porosity of the first region can be less than a desired porosity, while the average porosity of the second region can be greater than the desired porosity. Further, in some examples, the pores 1802 of the first region can be reduced in size by the surface treatment processes described herein. Accordingly, the pores 1802 of the first region can have a smaller or reduced average size relative to the pores 1804 of the second region.

In some examples, the first region can have fewer than 100,000 pores per cubic millimeter, fewer than 10,000 pores per cubic millimeter, or fewer than 1000 pores per cubic millimeter. In some examples, the first region can have an average pores size of less than about 10 microns, less than about 5 microns, less than about 3 microns, less than about 2 microns, or even less than about 1 micron or smaller. In some examples, the first region can have a porosity of about 2% or less, about 1.5% or less, about 1% or less, about 0.75% or less, about 0.5% or less, about 0.25% or less, about 0.1% or less, or even about 0.05% or less.

Figure 26C:
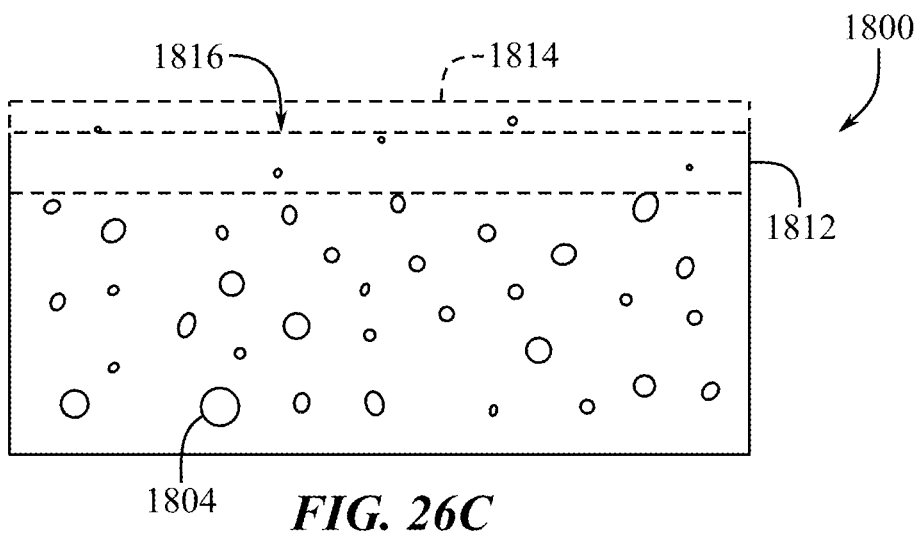
FIG. 26C shows a cross-sectional view of the portion of FIG. 26A after being subjected to a process.

FIG. 26C shows a cross-sectional view of the portion of the component 1800 of FIG. 26B after being subjected to a polishing process, or any other surface treatment or removal process. As can be seen, a region 1814 of the component 1800 can be removed from the surface to define or reveal a cosmetic surface 1816. Because the region 1814 is part of the first region 1812, and has a reduced or lowered porosity, the surface 1816 can be substantially free of revealed pores 1802. Whereas polishing the component 1800 shown in FIG. 26A may reveal pores 1802 as divots or other undesirable surface features, as can be seen in FIG. 26C, the region 1814 can have a substantially reduced porosity, and thus the cosmetic surface 1816 of the component 1800 can have a reduced number of divots or undesirable defects caused by pores as compared to the a component 1800 that has not undergone a surface treatment as described herein. As used herein, the term porosity can refer to a volume percentage of the component that comprises or includes pores or voids. Meanwhile, the density of a sample can be the volume percentage of the sample that includes solid material. The porosity of a sample can also be 100%, less the density of the material. That is, a sample with a porosity of 1% can have a density of 99%.

Figure 27:
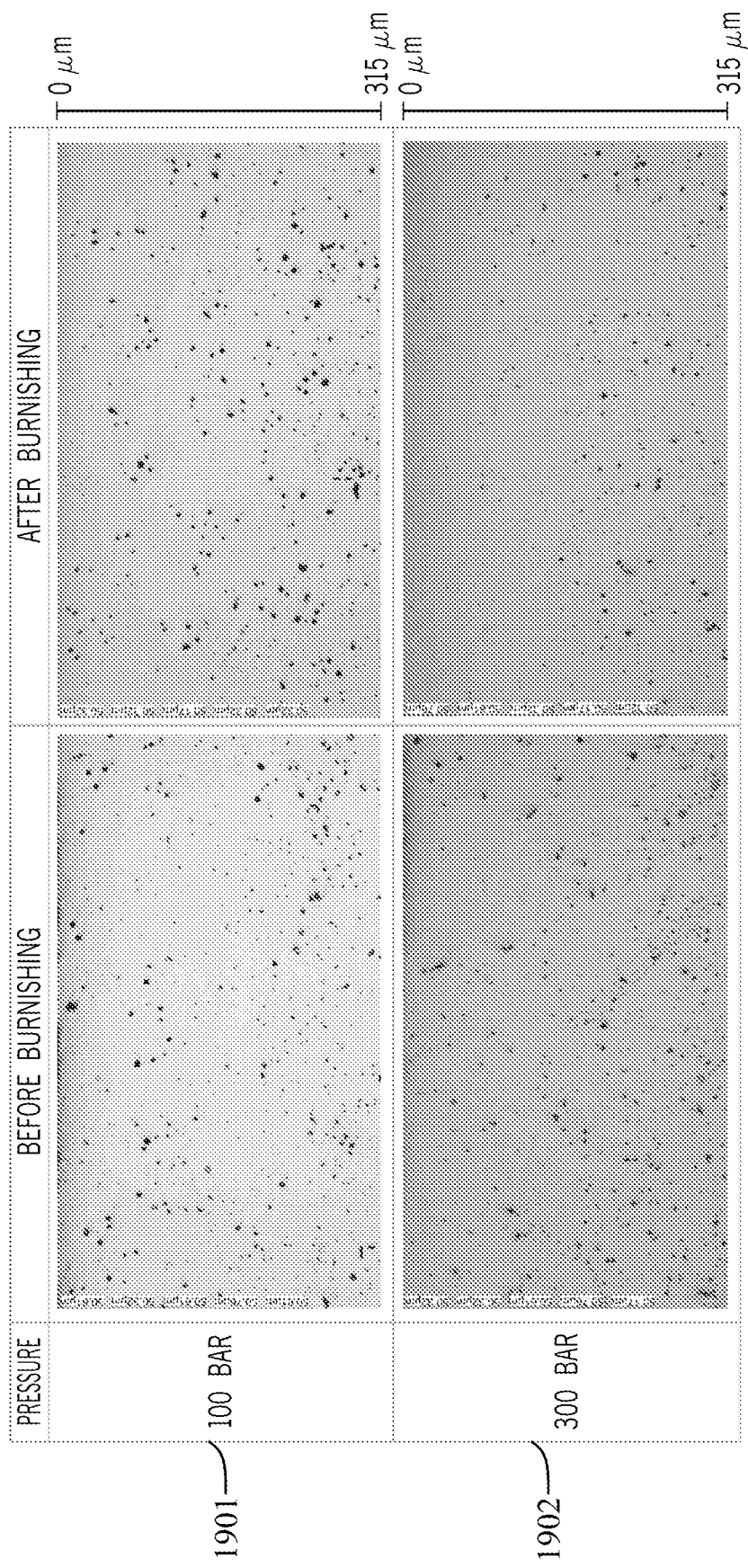
FIG. 27 shows a cross-sectional photograph of a portion of a sample component of an electronic device.

FIG. 27 shows cross-sectional photographs of portions of a first sample component 1901 and a second sample component 1902 before and after being subjected to surface treatments described herein. The cross-sectional photographs on the left show first and second sample components 1901, 1902 that have been formed by a metal injection molding (MIM) process. As can be seen, the components 1901, 1902 define a number of pores that are distributed throughout the shown cross-sectional area, and can extend from the surface (a depth of 0 microns) to a depth of 315 microns. Each sample was then subjected to a surface treatment as described herein, with a first sample 1901 being subjected to a process wherein a tool exerted a pressure of about 100 bar on the surface thereof, and the second sample 1902 being subjected to a process wherein a tool exerted a pressure of about 300 bar on the surface thereof.

The cross-sectional photographs on the right of FIG. 27 shows the samples 1901, 1902 after being subjected to the presently described surface treatment processes. As can be seen, the porosity of the samples 1901, 1902 has been reduced in a region extending from the surface to a depth below the surface. In the first sample 1901, the porosity is reduced in a region extending to a depth of about 20 to 50 microns. Further, as can be seen, both the size and number of pores in this region are reduced relative to the remainder of the sample 1901. The sample 1902 shows an even greater reduction in porosity and also includes a deeper or larger region of reduced porosity because of the higher pressure exerted by the tool during the surface treatment. As can be seen, the porosity of the region extending from the surface to a depth of about 150 microns has been greatly reduced relative to the untreated sample 1902 and as compared to the region below the reduced porosity region.

Figure 28:
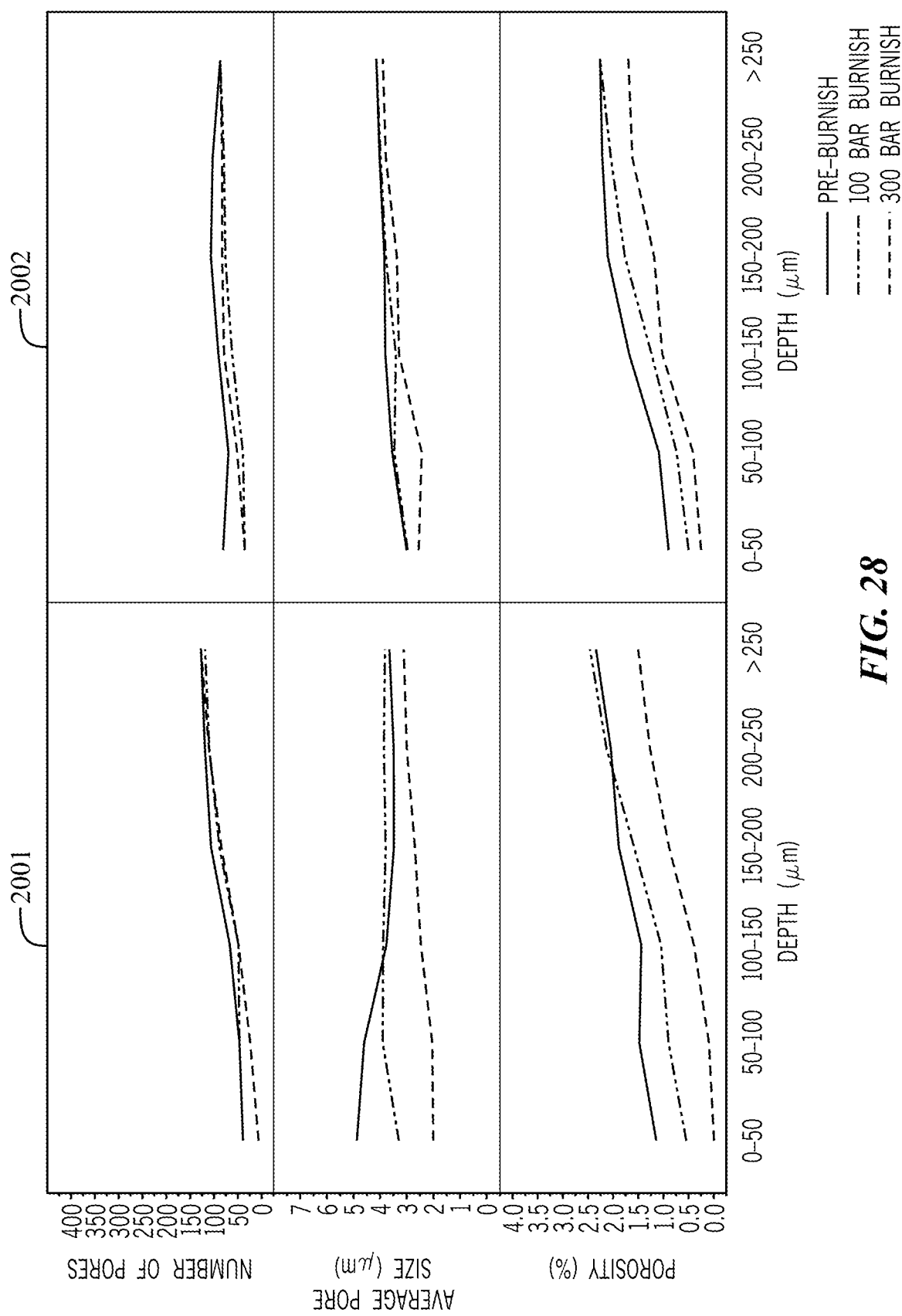
FIG. 28 shows graphs of porosity, pore size, and number of pores versus depth for sample components of an electronic device.

FIG. 28 shows graphs of porosity, average pore size, and number of pores versus depth for MIM sample components 2001 including a 316 L steel and MIM sample component 2002 including a relatively high nitrogen content steel alloy. The porosity, average pore size, and number of pores were measured for the samples 2001, 2002 prior to being subjected to any surface treatment process (labelled as Pre-Burnish), samples 2001, 2002 that had been subjected to a surface treatment process that exerted 100 bar of pressure on the samples (labelled as 100 Bar Burnish) and samples 2001, 2002 that had been subjected to a surface treatment process that exerted 300 bar of pressure on the samples (labelled as 300 Bar Burnish). As can be seen, the porosity, average pore size, and number of pores in the samples 2001, 2002 were reduced after the samples 2001, 2002 were subjected to the surface treatment processes described herein. The porosity, average pore size, and number of pores in the samples 2001, 2002 were also reduced in regions extending from the surface to depths of at least 50 microns, at least 150 microns, or even 250 microns or greater.

Any number or variety of electronic device components can include a component that has been subjected to a surface treatment, as described herein. The surface treatment or treatments can refine or modify a microstructure of some or all of the component, can densify or reduce the porosity of some or all of the component, and/or can align or reduce gaps between portions of the component. One or more of these surface treatments can include plastically deforming the surface to a desired depth, and/or applying a desired amount of pressure to the surface, as described herein. The component can then be treated, for example, by polishing or forming a surface layer. Various examples of components having been subjected to surface treatments as described herein, surface coatings, and processes for forming the same are described below with reference to FIGS. 29-31B.

Figure 29:
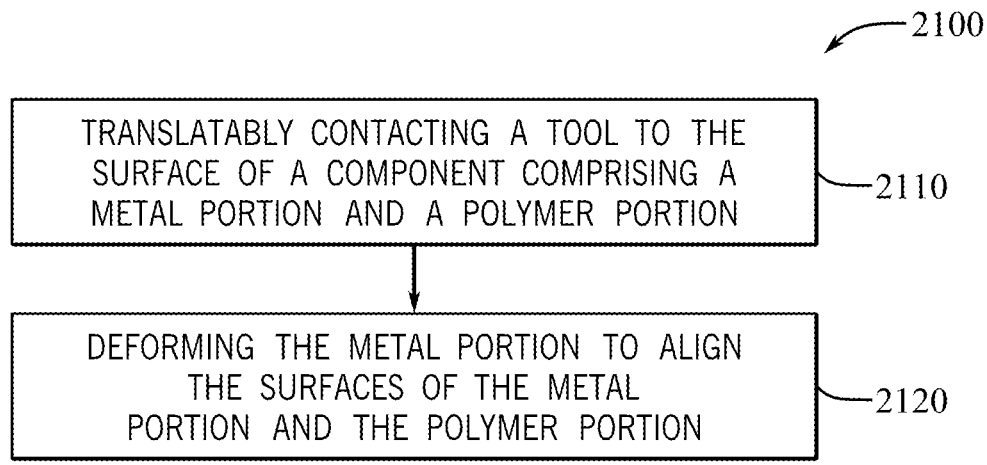
FIG. 29 shows a process flow diagram of a method for treating a component of an electronic device.

FIG. 29 illustrates a process flow diagram of an exemplary process 2100 for treating a component including a metal portion and a non-metal, or polymer portion, as described herein. The process 2100 for surface treating the component can include translatably contacting a tool to the surface of the component to plastically deform the surface of the metallic portion to a desired depth at block 2110, and aligning the surface of the metal portion with a surface of the polymer portion at block 2120.

At block 2110, a tool is translatably contacted to the surface or surfaces of the component at a desired location, for example, as described above with reference to FIGS. 9-11 and FIGS. 24A-24B. The tool can plastically deform the surface of the metallic portion, or metallic surface, to a depth of at least 12 microns, at least 15 microns, at least 20 microns, at least 25 microns, at least 30 microns, at least 40 microns, or at least 50 microns or more. Further, in some examples, the depth to which the tool plastically deforms the metallic surface can be varied at various desired locations or portions. The tool can be translated, for example, by sliding, grinding, or rolling at a desired rate. The tool can include a contact portion that is substantially similar to, and can include any of the features of, the contact portion 710 described with respect to FIGS. 9-11. A contact area of the tool on the surface can be less than 500 square microns. In some examples, the contact area can be less than 400 square microns, less than 300 square microns, less than 250 square microns, less than 200 square microns, less than 150 square microns, or less than 100 square microns.

At block 2120, the metal portion is plastically deformed to align the surface of the metal portion with surface of the polymer portion, for example, as described with respect to FIG. 24B. In some examples, the surfaces of the metal portion and the polymer portion can be aligned in or with a single plane. In some examples, the component being subjected to the surface treatment 2100 can include multiple metal portions adjacent to one or more polymer portions, and the surfaces of each of these portions can be aligned. Further, as described with respect to FIG. 24B, in some examples, block 2120 can include reducing a size of, and/or closing any gaps between, a metal portion and a non-metal or polymer portion of the component.

Figure 30:
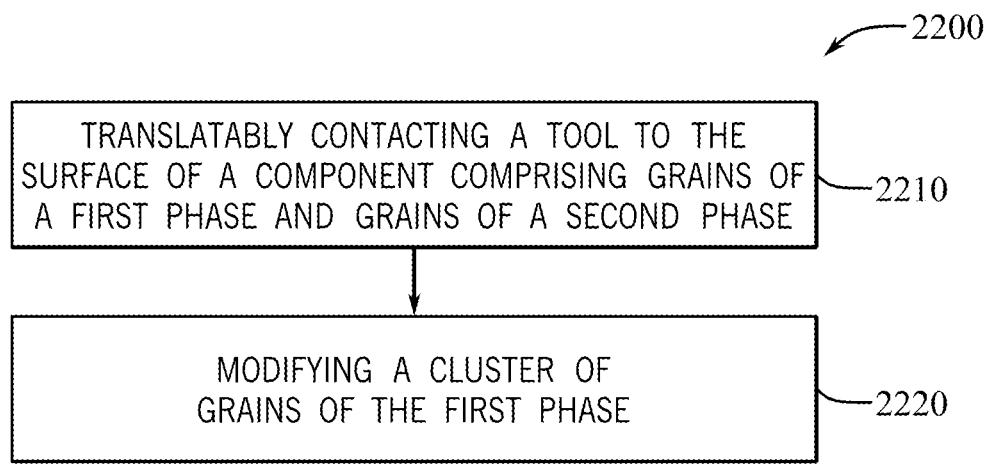
FIG. 30 shows a process flow diagram of a method for treating a component of an electronic device.

FIG. 30 illustrates a process flow diagram of an exemplary process 2200 for treating a component including grains of a first phase, such as an intermetallic sigma phase, at least partially surrounded by grains of a second phase, such as a metallic austenitic phase. The process 2200 for surface treating the component can include translatably contacting a tool to the surface of the component to plastically deform the surface of the metallic portion to a desired depth at block 2210, and as described with respect to FIGS. 25A-25C. The process 2200 can also include modifying a cluster of grains of the first phase so that grains of the second phase are disposed between at least some of the grains of the first phase at block 2220, and as described with respect to FIG. 25D. In some examples, block 2220 can further include reducing an average grain size of the grains of the first phase positioned at or underlying a region of the surface being contacted at block 2210, as described with respect to FIG. 25D.

Figure 31A:
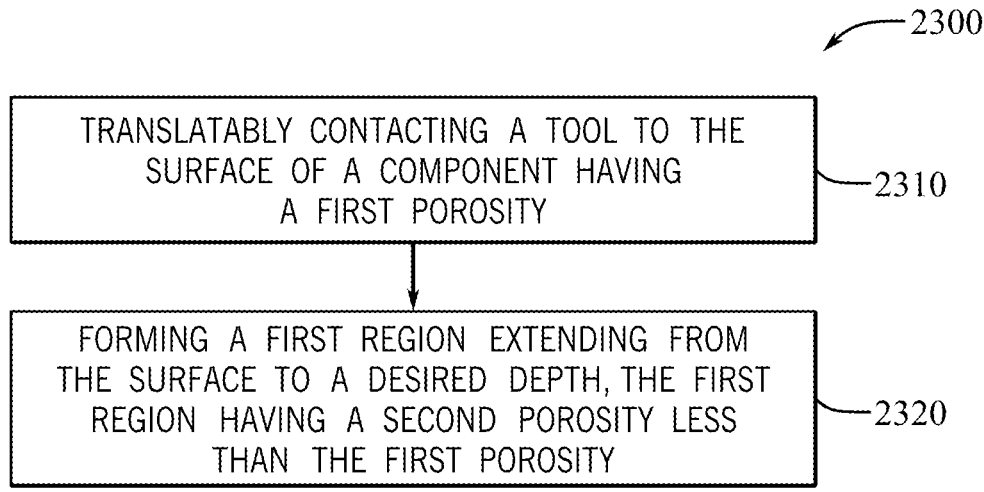
FIG. 31A shows a process flow diagram of a method for treating a component of an electronic device.

FIG. 31A illustrates a process flow diagram of an exemplary process 2300 for surface treating a component having a first porosity and formed by a powder metallurgy process, as described herein. The process 2300 can include translatably contacting a tool to the surface of the component to plastically deform the surface to a desired depth at block 2310, and forming a first region extending from the surface to a first depth, the first region having a second smaller porosity, average pore size, and/or number of pores than a second region extending from the first region into the component, at block 2320 and as described with respect to FIGS. 26A-28.

Figure 31B:
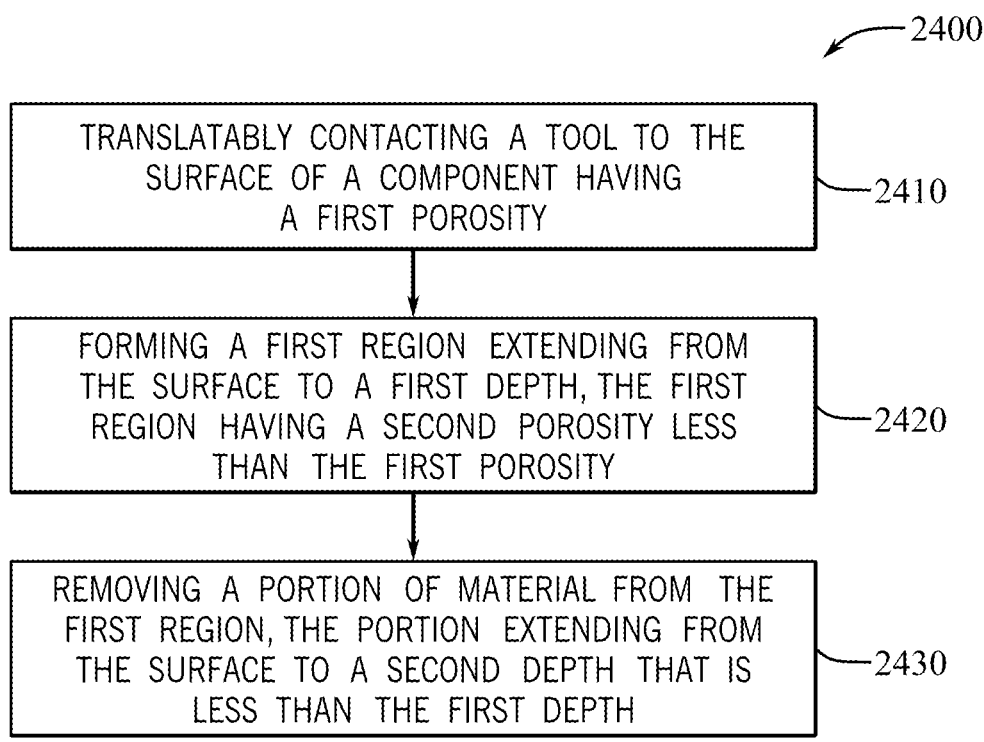
FIG. 31B shows a process flow diagram of a method for treating a component of an electronic device.

FIG. 31B illustrates a process flow diagram of an exemplary process 2400 for surface treating a component having a first porosity and formed by a powder metallurgy process, as described herein. The process 2400 can include translatably contacting a tool to the surface of the component to plastically deform the surface to a desired depth at block 2410, forming a first region extending from the surface to a first depth, the first region having a second smaller porosity, average pore size, and/or number of pores than a second region extending from the first region into the component, at block 2420 and as described with respect to FIGS. 26A-28, and removing a portion of material from the first region, for example through a polishing process, the portion extending from the surface to a second depth that is less than the first depth.

Any of the features or aspects of the components discussed herein can be combined or included in any varied combination. For example, the design and shape of the component is not limited in any way and can be formed by any number of processes, including those discussed herein. Further, a component including any of the features and/or structures described herein can be formed by any method now known or discovered in the future, even during formation of the component itself. A component including a portion or portions having a refined grain structure, modified porosity, modified grains structure, and/or any other features, as discussed herein, can be or can form all or a portion of a component, such as a housing or enclosure, for an electronic device. The component can also be or form any number of additional components of an electronic device, including internal components, external components, cases, surfaces, or partial surfaces.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

As used herein, the terms exterior, outer, interior, inner, top, and bottom are used for reference purposes only. An exterior or outer portion of a component can form a portion of an exterior surface of the component but may not necessarily form the entire exterior of outer surface thereof. Similarly, the interior or inner portion of a component can form or define an interior or inner portion of the component but can also form or define a portion of an exterior or outer surface of the component. A top portion of a component can be located above a bottom portion in some orientations of the component, but can also be located in line with, below, or in other spatial relationships with the bottom portion depending on the orientation of the component.

Various inventions have been described herein with reference to certain specific embodiments and examples. However, they will be recognized by those skilled in the art that many variations are possible without departing from the scope and spirit of the inventions disclosed herein, in that those inventions set forth in the claims below are intended to cover all variations and modifications of the inventions disclosed without departing from the spirit of the inventions. The terms "including:" and "having" come as used in the specification and claims shall have the same meaning as the term "comprising."

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A component for an electronic device, comprising:
   a metallic body at least partially defining an exterior surface;
   the metallic body having a porosity less than 1% in a first region that extends from the external surface to a depth of at least 100 microns; and the metallic body having a porosity greater than 1% in a second region adjacent to the first region, the first region having a smaller average grain size than the second region.

2. The component of claim 1, wherein the metallic body comprises a metal injection molded body.

3. The component of claim 1, wherein the metallic body has a porosity less than 0.5% in the first region.

4. The component of claim 1, wherein the metallic body comprises steel.

5. The component of claim 1, wherein the metallic body comprises aluminum.

6. The component of claim 1, wherein the metallic body has fewer than 1000 pores per cubic millimeter in the first region.

7. The component of claim 1, wherein the metallic body has an average pore size of less than about 3 microns in the first region in a gradient distribution.

8. The component of claim 1, wherein a portion of the exterior surface is polished.

9. The component of claim 1, wherein the exterior surface comprises an exterior surface of the electronic device.

10. The component of claim 1, wherein the component comprises a SIM tray.

11. A method of treating a component for an electronic device, comprising:
    contacting a surface of a metallic region the component with a tool to plastically deform the region, the tool exerting a pressure of at least 100 bar on the surface and translating across the surface at a rate of at least 1.25 meters per minute (m/min), the metallic region having a porosity less than 1%, the region extending from the external surface to a depth of at least 100 microns, and the metallic region having a smaller average grain size in the depth than below the depth; and
    modifying a cluster of first grains positioned at the region so that at least some of the first grains are disposed between at least some second grains at the region, the first grains comprising a first phase and the second grains comprising a second, different phase.

12. The method of claim 11, further comprising reducing an average grain size of the first grains.

13. The method of claim 11, wherein the metallic surface comprises steel.

14. The method of claim 13, wherein the first phase comprises a sigma phase.

15. The method of claim 11, further comprising polishing the surface.

* * * * *